(12) United States Patent
Yacobucci

(10) Patent No.: US 7,203,877 B2
(45) Date of Patent: Apr. 10, 2007

(54) FAILURE ANALYSIS AND TESTING OF SEMI-CONDUCTOR DEVICES USING INTELLIGENT SOFTWARE ON AUTOMATED TEST EQUIPMENT (ATE)

(75) Inventor: Roger Yacobucci, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 122 days.

(21) Appl. No.: 11/028,695

(22) Filed: Jan. 4, 2005

(65) Prior Publication Data

US 2006/0150041 A1 Jul. 6, 2006

(51) Int. Cl.
*G01R 31/28* (2006.01)
(52) U.S. Cl. ..................................... 714/726
(58) Field of Classification Search ............... None
See application file for complete search history.

(56) References Cited

U.S. PATENT DOCUMENTS

| | | | | |
|---|---|---|---|---|
| 5,497,379 A | * | 3/1996 | Whetsel | 714/731 |
| 6,473,707 B1 | * | 10/2002 | Grey | 702/123 |
| 6,539,497 B2 | * | 3/2003 | Swoboda et al. | 714/30 |

* cited by examiner

*Primary Examiner*—Christine T. Tu
(74) *Attorney, Agent, or Firm*—Trexler, Bushnell, Giangiorgi, Blackstone & Marr, Ltd

(57) ABSTRACT

The invention provides a number of related methods which improve the test and analysis of integrated circuit devices. A first method of the invention provides a method for pausing on a SCAN based test. A second method of the invention provides a method for using stimulations and responses of a known good device to increase fault coverage of patterns in a test flow. A third method of the invention provides a method to curve trace device buffers on an ATE.

3 Claims, 3 Drawing Sheets

FAILURE ANALYSIS AND TESTING OF SEMI-CONDUCTOR DEVICES USING INTELLIGENT SOFTWARE ON AUTOMATED TEST EQUIPMENT (ATE)

BACKGROUND

The invention generally applies to the test and analysis of Integrated Circuit devices.

The inherent software and hardware architecture of many Automatic Test Equipment (ATE) platforms do not allow for pauses during the execution of serialized SCAN based tests. However, many of the failure analysis techniques require the ability to pause on a test, such as SCAN, in order to perform many of the tasks associated with a root cause failure analysis. For example, in order to collect electrical current measurements on pattern vectors the test must be paused at each vector, the device under test is conditioned as desired, and then an electrical current measurement is made. The test is then resumed, the next vector is executed, the test is paused, the device under test is conditioned as desired, and then an electrical current measurement is made, and so forth.

Currently, SCAN based patterns use a combination of parallel and serial vectors in order to reduce the amount of memory used on many ATE platforms. Typically, an ATE platform will provide the ability to pause on a parallel vector, so one method of pausing on serial vectors of a SCAN based test is to convert the serial vectors into parallel vectors. This existing approach of converting the serialized vectors to parallel vectors, however, has a number of disadvantages.

First of all, when the serial vectors in a SCAN pattern are converted to parallel vectors, the pattern becomes very large. Many times the pattern becomes so large that it will not fit into the tester's parallel vector memory. Therefore, the method will not work. At other times, the pattern will fit, but the other patterns in the test program have to be removed to make room for the converted SCAN pattern. This requires extensive modifications to the test program.

Second, converting the serialized vectors to parallel vectors and then modifying the test program to accommodate them is typically outside the expertise of the typical personnel who are responsible for failure analysis tasks. Therefore, this method is seldom used because of the inherent problems it creates on tester resources and test program code.

Third, once the serial vectors are converted, the patterns must be recompiled, the test program must be modified, and, if there are several SCAN patterns failing, these tasks are required for each failing pattern. This effort becomes very time consuming and often times required the assistance of a Test Engineer. Therefore, it is both costly and impacts the cycle time required to complete the failure analysis on a device.

Device simulations are used by integrated circuit design engineers to generate patterns that are used in the test of a device. However, due to design and logic layouts there are areas of a device that cannot be simulated. This leads to a decrease in the test fault coverage that in turn leads to devices that pass all production test flows, but fail in the customer applications.

In order to solve this problem, sometimes there are opportunities to re-simulate a design to increase the fault coverage. However, in many cases the logic cannot be simulated. Another alternative is to re-spin the design to add logic that allows for additional simulation, but this isn't always practical and is seldom done.

These existing approaches, however, has a number of disadvantages. First, re-simulation and re-design are very costly. Second, re-simulation and re-design can take many months to accomplish, which is unacceptable in a time-to-market environment. Third, re-simulation and re-design are not always successful. Fourth, re-designing a part can lead to other problems. In other words, sometimes the new design doesn't work and another re-spin is required.

A current computer program has been designed to function on the Credence automatic test equipment (ATE) platform, however, the features provided by the software can be written to work across different ATE platforms. The program provides the ability to curve trace the input and output pin (buffer) characteristics of a device under test. This is also known as curve tracing. The program is incorporated into the test program and use the standard Credence ATE test and debugger elementals to characterize the buffers and then stores the data for further analysis. This eliminates the need to use additional offline equipment to characterize and curve trace device buffers. The program provides the option of either viewing the curve traces during a tester session using the standard UNIX 2D plot routine (GNUPLOT) or an offline software package such as Microsoft EXCEL. Of course, other graphic packages exist that could utilize the data as well. The program also provides the capability to store data that can then be evaluated using offline statistical and mathematically analysis packages to evaluate and characterize the buffers. Thus, the program offers the ability to curve trace buffers during a test session and then store the data for offline evaluation.

The known approach for solving this problem is oscilloscopes, which are used to curve trace. Oscilloscopes, though, are cumbersome to use when large numbers of buffers are to be examined. Oscilloscopes are lacking for a number of different reasons. In particular, oscilloscopes: do not automatically curve trace a user defined pin list; do not utilize the existing automatic test equipments hardware and software utilities; must be manually set up for each pin which can be very time consuming and costly; do not provide a data file for a group of pins that can be analyzed offline; do not provide an interface to the existing UNIX gnuplot utility; do not provide test limit and alarming capability; and do not provide an operator interface that resides in the ATE test programs flow.

OBJECTS AND SUMMARY

A primary object of an embodiment of the invention is to provide the capability to pause on any link within a chain on any ATE that utilizes looping and SCAN memory.

Another primary object of an embodiment of the invention is to provide the capability to pause on any link in a SCAN pattern, but which does not require any permanent changes to the SCAN pattern or test program flow.

Yet another primary object of an embodiment of the invention is that it uses the stimulations and responses of a known good device to increase the fault coverage of the patterns in the test flow by changing the patterns to include additional strobes in the pattern vectors that could not be determined during simulations.

Still another primary object of an embodiment of the invention is to provide the availability to easily and automatically curve trace device buffers on an ATE.

Briefly, and in accordance with the foregoing, the invention provides a number of related methods which improve the test and analysis of integrated circuit devices. A first method of the invention provides a method for pausing on a SCAN based test. A second method of the invention provides a method for using stimulations and responses of a known good device to increase fault coverage of patterns in a test flow. A third method of the invention provides a method to curve trace device buffers on an ATE.

ters: XXXXXLHHHLLHLHL, the links could be rewritten for each execution of the parallel partition as displayed in Table 1.

TABLE 1

|  | Link 01 | Link 02 | Link 03 | Link 04 | Link 05 | Link 06 | Link 07 | Link 08 | Link 09 | Link 10 | Link 11 | Link 12 | Link 13 | Link 14 | Link 15 |
|---|---|---|---|---|---|---|---|---|---|---|---|---|---|---|---|
| Execution 01 SCAN Data: | L | X | X | X | X | X | X | X | X | X | X | X | X | X | X |
| Execution 02 SCAN Data: | X | L | X | X | X | X | X | X | X | X | X | X | X | X | X |
| Execution 03 SCAN Data: | X | X | L | X | X | X | X | X | X | X | X | X | X | X | X |
| Execution 04 SCAN Data: | X | X | X | L | X | X | X | X | X | X | X | X | X | X | X |
| Execution 05 SCAN Data: | X | X | X | X | L | X | X | X | X | X | X | X | X | X | X |
| Execution 06 SCAN Data: | X | X | X | X | X | L | X | X | X | X | X | X | X | X | X |
| Execution 07 SCAN Data: | X | X | X | X | X | X | L | X | X | X | X | X | X | X | X |
| Execution 08 SCAN Data: | X | X | X | X | X | X | X | L | X | X | X | X | X | X | X |
| Execution 09 SCAN Data: | X | X | X | X | X | X | X | X | L | X | X | X | X | X | X |
| Execution 10 SCAN Data: | X | X | X | X | X | X | X | X | X | L | X | X | X | X | X |
| Execution 11 SCAN Data: | X | X | X | X | X | X | X | X | X | X | L | X | X | X | X |
| Execution 12 SCAN Data: | X | X | X | X | X | X | X | X | X | X | X | L | X | X | X |
| Execution 13 SCAN Data: | X | X | X | X | X | X | X | X | X | X | X | X | L | X | X |
| Execution 14 SCAN Data: | X | X | X | X | X | X | X | X | X | X | X | X | X | L | X |
| Execution 15 SCAN Data: | X | X | X | X | X | X | X | X | X | X | X | X | X | X | L |

BRIEF DESCRIPTION OF THE DRAWINGS

The features of the invention which are believed to be novel are described in detail hereinbelow. The organization and manner of the structure and operation of the invention, together with further objects and advantages thereof, may best be understood by reference to the following description taken in connection with the accompanying drawings wherein like reference numerals identify like elements in which.

DESCRIPTION

Figure 1:
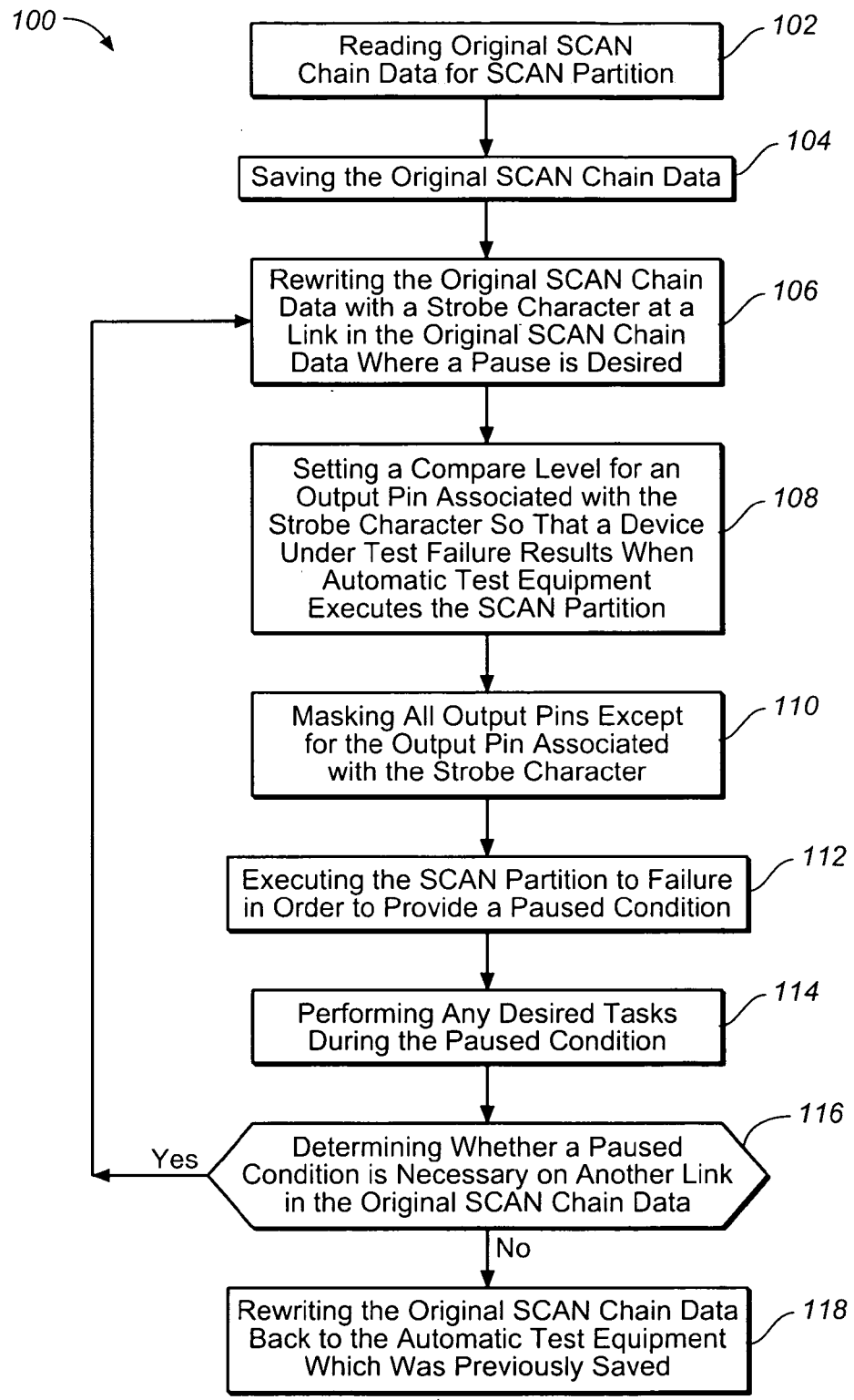
FIG. 1 illustrates a flow chart depicting a first method of the invention.

While the invention may be susceptible to embodiment in different forms, there is shown in the drawings, and herein will be described in detail, specific embodiments of the invention. The present disclosure is to be considered an example of the principles of the invention, and is not intended to limit the invention to that which is illustrated and described herein.

The invention provides a method 100 for pausing on a SCAN based test. The method 100 uses a unique technique to force the ATE to halt execution of the SCAN pattern at any link in a scan chain for any number of SCAN partitions. The method 100 includes a number of individual steps, as illustrated in FIG. 1.

The method 100 preferably begins with step 102, which is to read the SCAN chain data for a SCAN partition.

Step 104 of the method 100 is to save the original SCAN chain data.

Step 106 of the method 100 is to rewrite the SCAN chain data with a walking or standing strobe character, such as an "L", at the link in the chain where the pause is desired. For example, if the original SCAN chain data had fifteen (15) links, and those links included the following strobe charac- Step 108 of the method 100 is to set the compare level for output pin associated with the walking or standing character so that a device under test (DUT) failure results when the ATE executes the SCAN partition. For example, the compare level would be set to −1.0 volt, which will cause the output low "L" strobe to fail.

Step 110 of the method 100 is to mask all output pins except for the output pin with the walking or standing strobe character.

Step 112 of the method 1100 is to execute the partition to failure. The test will thus be suspended or paused during the execution of the partition at the link in the chain where the walking or standing strobe resides.

Step 114 of the method 100 is to perform any other tasks required during the paused condition.

Step 116 is to determine whether a pause is necessary on another link. If another pause is necessary, return to step 106 of the method 100 and again follow steps 106, 108, 110, 112, 114 and 116. If another pause if not necessary, move forward to step 118 of the method 100. In other words, the method 100 can be used to stop on a specific link within a chain as opposed to successive links within a chain. For example, if a user only wants to stop on link 10, as shown in TABLE 1, then the ATE's SCAN memory would only be suspended or paused once with the information shown in "Execution 10 SCAN Data".

Step 118 is to rewrite the original SCAN chain characters back to the ATE's SCAN memory, which was saved in step 104 of the method 100. The method 100 finishes with the completion of step 118. Thus, the original SCAN pattern exists once the user is finished with the method 100.

A walking "H" or some other strobe character with the appropriate compare level that would cause a failure may also be used to initiate the pause condition. The characters preceding the walking strobe characters, as shown in TABLE 1, are don't care "X" characters. These don't care "X" characters prevent a failure from occurring prior to the walking strobe character. The characters that follow the walking strobe characters, an "X" as shown in TABLE 1, are of no consequence because the walking strobe character is what causes the failure and curtails the test. The walking strobe character pauses the test at the desired link in the chain.

Although a SCAN based pattern may include multiple chains, the method 100 only requires that the walking strobe or standing strobe be placed on any one chain since all of the chains are executed simultaneously. The output pins on the other chains are masked in step 110 so that only the chain with the walking strobe causes the pause state for all chains irrespective of their output strobe characters.

The method 100 thus provides the capability to pause on any link within a chain on any ATE that utilizes looping and SCAN memory. The method 100 further provides the capability to pause on any link in a SCAN pattern, but it does not require any permanent changes to the SCAN pattern or test program flow. Thus, the method 100 does not have any of the disadvantages associated with the existing approaches, as described in the Background section.

Also, although the method 100 is geared toward applications involving serialized pattern vectors, it can be utilized in applications involving parallel vector patterns as well. However, ATE's typically provide other methods for pausing on parallel vectors.

Tables 2–4 provide an example use of a walking strobe to collect IDD data while paused on the chain links of a SCAN based pattern. Table 2 is an actual data log of failures when using a walking "L" strobe character on a SCAN based pattern with Partitions 40–41: Chains 0–255. Table 3 is an actual data log of a test program run using a walking "L" strobe character to collect IDD data while paused on the links of a chain in a SCAN based pattern with Partitions 40–41: Chains 0–255. Table 4 is actual IDD data that was collected by using a walking "L" strobe character to pause on the links of a chain in a SCAN based pattern with Partitions 40–41: Chains 0–255.

TABLE 2

```
script file 'example_run.log' is opened
begin> data fct
begin> pause test blkll
begin>
  STDF Version 4 has been enabled
STDF collection file '/home3/STDF/coll_UNSPECIFIED.std' is opened.
BLK_OS_FUN_CON                              8 to 342            pass
BLK_OS_FUN_SRT                              8 to 342            pass
f res
BLK_A_FUNC_MIN                            360 to 235519         pass
BLK_B1_FUNC_MIN                        235520 to 315127         pass
BLK_B2_FUNC_MIN                        315128 to 490479         pass
BLK_C1_FUNC_MIN                        490480 to 660943         pass
BLK_C3_FUNC_MIN                        660944 to 798527         pass
BLK_C5_FUNC_MIN                        798528 to 1042919        pass
BLK_C6_FUNC_MIN                       1042920 to 1121375        pass
BLK_C7_FUNC_MIN                       1121376 to 1191319        pass
BLK_D1_FUNC_MIN                       1191320 to 1207167        pass
BLK_D2_FUNC_MIN                       1207168 to 1239743        pass
BLK_D3_FUNC_MIN                       1239744 to 1369391        pass
BLK_E1_FUNC_MIN                       1369392 to 1704319        pass
BLK_E2_FUNC_MIN                       1704320 to 2135047        pass
BLK_E3_FUNC_MIN                       2135048 to 2191079        pass
BLK_E4_FUNC_MIN                       2191080 to 2349191        pass
BLK_F1_FUNC_MIN                       2349192 to 2401743        pass
BLK_F2_FUNC_MIN                       2401744 to 2725007        pass
BLK_H_FUNC_MIN                        2725008 to 2731743        pass
BLK_Q_FUNC_MIN                        2915464 to 2958815        pass
BLK_G_FUNC_MIN                        2890472 to 2901951        pass
Pause in "BLKL1" due to test name
test_name(name="BLKL1")
break> pause fct
break>
BLK_L1_FAST_SCAN                      2958816 to 2960439        pass
Pause in "BLK_L1_FAST_SCAN" due to functional pass
func_test(func_pins = OBPIN, start_vec = 2958816 , stop_vec = 2960439)
break> data fail
break> faq
BLK_L1_FAST_SCAN                      2959030 to 2959045        *FAIL*
    LOW FAIL = .
    HIGH FAIL = /
    TRISTATE FAIL = *
    SX:NO COMPARE = –
Vector   Loop   Cycle        FAILED DUT PIN
2959041    1    522
SC     40:0    Cnt 3         .D249_TX_DI P23
BLK_L1_FAST_SCAN                      2959030 to 2959045        *FAIL*
    LOW FAIL = .
    HIGH FAIL = /
    TRISTATE FAIL = *
    SX:NO COMPARE = –
Vector   Loop   Cycle        FAILED DUT PIN
2959041    2    523
SC     40:1    Cnt 3         .D249_TX_DI P23
BLK_L1_FAST_SCAN                      2959030 to 2959045        *FAIL*
    LOW FAIL = .
    HIGH FAIL = /
```

TABLE 2-continued

```
         TRISTATE FAIL = *
         SX:NO COMPARE = -
      Vector   Loop    Cycle          FAILED DUT PIN
      2959041   3      524
      SC     40:2     Cnt 3         .D249_TX_DI P23
      BLK_L1_FAST_SCAN                              2959030 to 2959045  *FAIL*
         LOW FAIL = .
         HIGH FAIL = /
         TRISTATE FAIL = *
         SX:NO COMPARE = -
      Vector   Loop    Cycle          FAILED DUT PIN
      2959041   4      525
      SC     40:3     Cnt 3         .D249_TX_DI P23
.
.
.
.
.
      BLK_L1_FAST_SCAN                              2959030 to 2959045  *FAIL*
         LOW FAIL = .
         HIGH FAIL = /
         TRISTATE FAIL = *
         SX:NO COMPARE = -
      Vector   Loop    Cycle          FAILED DUT PIN
      2959041   251    772
      SC     40:250   Cnt 3         .D249_TX_DI P23
      BLK_L1_FAST_SCAN                              2959030 to 2959045  *FAIL*
         LOW FAIL = .
         HIGH FAIL = /
         TRISTATE FAIL = *
         SX:NO COMPARE = -
      Vector   Loop    Cycle          FAILED DUT PIN
      2959041   252    773
      SC     40:251   Cnt 3         .D249_TX_DI P23
      BLK_L1_FAST_SCAN                              2959030 to 2959045  *FAIL*
         LOW FAIL = .
         HIGH FAIL = /
         TRISTATE FAIL = *
         SX:NO COMPARE = -
      Vector   Loop    Cycle          FAILED DUT PIN
      2959041   253    774
      SC     40:252   Cnt 3         .D249_TX_DI P23
      BLK_L1_FAST_SCAN                              2959030 to 2959045  *FAIL*
         LOW FAIL = .
         HIGH FAIL = /
         TRISTATE FAIL = *
         SX:NO COMPARE = -
      Vector   Loop    Cycle          FAILED DUT PIN
      2959041   254    775
      SC     40:253   Cnt 3         .D249_TX_DI P23
      BLK_L1_FAST_SCAN                              2959030 to 2959045  *FAIL*
         LOW FAIL = .
         HIGH FAIL = /
         TRISTATE FAIL = *
         SX:NO COMPARE = -
      Vector   Loop    Cycle          FAILED DUT PIN
      2959041   255    776
      SC     40:254   Cnt 3         .D249_TX_DI P23
      BLK_L1_FAST_SCAN                              2959030 to 2959045  *FAIL*
         LOW FAIL = .
         HIGH FAIL = /
         TRISTATE FAIL = *
         SX:NO COMPARE = -
      Vector   Loop    Cycle          FAILED DUT PIN
      2959041   256    777
      SC     40:255   Cnt 3         .D249_TX_DI P23
      BLK_L1_FAST_SCAN                              2959035 to 2959050  *FAIL*
         LOW FAIL = .
         HIGH FAIL = /
         TRISTATE FAIL = *
         SX:NO COMPARE = -
      Vector   Loop    Cycle          FAILED DUT PIN
      2959046   1      522
      SC     41:0     Cnt 3         .D249_TX_DI P23
      BLK_L1_FAST_SCAN                              2959035 to 2959050  *FAIL*
         LOW FAIL = .
         HIGH FAIL = /
         TRISTATE FAIL = *
         SX:NO COMPARE = -
```

TABLE 2-continued

| Vector | Loop | Cycle | FAILED DUT PIN | | |
|---|---|---|---|---|---|
| 2959046 | 2 | 523 | | | |
| SC | 41:1 | Cnt 3 | .D249_TX_DI P23 | | |
| BLK_L1_FAST_SCAN | | | | 2959035 to 2959050 | *FAIL* |
| LOW FAIL = . | | | | | |
| HIGH FAIL = / | | | | | |
| TRISTATE FAIL = * | | | | | |
| SX:NO COMPARE = − | | | | | |
| Vector | Loop | Cycle | FAILED DUT PIN | | |
| 2959046 | 3 | 524 | | | |
| SC | 41:2 | Cnt 3 | .D249_TX_DI P23 | | |
| BLK_L1_FAST_SCAN | | | | 2959035 to 2959050 | *FAIL* |
| LOW FAIL = . | | | | | |
| HIGH FAIL = / | | | | | |
| TRISTATE FAIL = * | | | | | |
| SX:NO COMPARE = − | | | | | |
| Vector | Loop | Cycle | FAILED DUT PIN | | |
| 2959046 | 4 | 525 | | | |
| SC | 41:3 | Cnt 3 | .D249_TX_DI P23 | | |
| BLK_L1_FAST_SCAN | | | | 2959035 to 2959050 | *FAIL* |
| LOW FAIL = . | | | | | |
| HIGH FAIL = / | | | | | |
| TRISTATE FAIL = * | | | | | |
| SX:NO COMPARE = − | | | | | |
| Vector | Loop | Cycle | FAILED DUT PIN | | |
| 2959046 | 5 | 526 | | | |
| SC | 41:4 | Cnt 3 | .D249_TX_DI P23 | | |
| BLK_L1_FAST_SCAN | | | | 2959035 to 2959050 | *FAIL* |
| LOW FAIL = . | | | | | |
| HIGH FAIL = / | | | | | |
| TRISTATE FAIL = * | | | | | |
| SX:NO COMPARE = − | | | | | |
| Vector | Loop | Cycle | FAILED DUT PIN | | |
| 2959046 | 6 | 527 | | | |
| SC | 41:5 | Cnt 3 | .D249_TX_DI P23 | | |
| . | | | | | |
| . | | | | | |
| . | | | | | |
| . | | | | | |
| . | | | | | |
| . | | | | | |
| . | | | | | |
| D249_TX_DI P23 | | | | | |
| BLK_L1_FAST_SCAN | | | | 2959035 to 2959050 | *FAIL* |
| LOW FAIL = . | | | | | |
| HIGH FAIL = / | | | | | |
| TRISTATE FAIL = * | | | | | |
| SX:NO COMPARE = − | | | | | |
| Vector | Loop | Cycle | FAILED DUT PIN | | |
| 2959046 | 251 | 772 | | | |
| SC | 41:250 | Cnt 3 | .D249_TX_DI P23 | | |
| BLK_L1_FAST_SCAN | | | | 2959035 to 2959050 | *FAIL* |
| LOW FAIL = . | | | | | |
| HIGH FAIL = / | | | | | |
| TRISTATE FAIL = * | | | | | |
| SX:NO COMPARE = − | | | | | |
| Vector | Loop | Cycle | FAILED DUT PIN | | |
| 2959046 | 252 | 773 | | | |
| SC | 41:251 | Cnt 3 | .D249_TX_DI P23 | | |
| BLK_L1_FAST_SCAN | | | | 2959035 to 2959050 | *FAIL* |
| LOW FAIL = . | | | | | |
| HIGH FAIL = / | | | | | |
| TRISTATE FAIL = * | | | | | |
| SX:NO COMPARE = − | | | | | |
| Vector | Loop | Cycle | FAILED DUT PIN | | |
| 2959046 | 253 | 774 | | | |
| SC | 41:252 | Cnt 3 | .D249_TX_DI P23 | | |
| BLK_L1_FAST_SCAN | | | | 2959035 to 2959050 | *FAIL* |
| LOW FAIL = . | | | | | |
| HIGH FAIL = / | | | | | |
| TRISTATE FAIL = * | | | | | |
| SX:NO COMPARE = − | | | | | |
| Vector | Loop | Cycle | FAILED DUT PIN | | |
| 2959046 | 254 | 775 | | | |
| SC | 41:253 | Cnt 3 | .D249_TX_DI P23 | | |
| BLK_L1_FAST_SCAN | | | | 2959035 to 2959050 | *FAIL* |
| LOW FAIL = . | | | | | |
| HIGH FAIL = / | | | | | |
| TRISTATE FAIL = * | | | | | |

TABLE 2-continued

```
    SX:NO COMPARE = –
Vector  Loop   Cycle       FAILED DUT PIN
2959046  255    776
SC     41:254   Cnt 3      .D249_TX_DI P23
BLK_L1_FAST_SCAN                             2959035 to 2959050  *FAIL*
       LOW FAIL = .
      HIGH FAIL = /
   TRISTATE FAIL = *
    SX:NO COMPARE = –
Vector  Loop   Cycle       FAILED DUT PIN
2959046  256    777
SC     41:255   Cnt 3      .D249_TX_DI P23
break> quit
                           scansignolog2.txt
Enter ^A <advance> to start
      ^F <finish> to stop
      ^P          to pause
begin> data fct
begin> pause test blk11
begin>
   STDF Version 4 has been enabled
STDF collection file '/home3/STDF/coll_UNSPECIFIED.std' is opened.
BLK_OS_FUN_CON                             8 to 342          pass
BLK_OS_FUN_SRT                             8 to 342          pass
BLK_A_FUNC_MIN                           360 to 235519       pass
BLK_B1_FUNC_MIN                       235520 to 315127       pass
BLK_B2_FUNC_MIN                       315128 to 490479       pass
BLK_C1_FUNC_MIN                       490480 to 660943       pass
BLK_C3_FUNC_MIN                       660944 to 798527       pass
BLK_C5_FUNC_MIN                       798528 to 1042919      pass
BLK_C6_FUNC_MIN                      1042920 to 1121375      pass
BLK_C7_FUNC_MIN                      1121376 to 1191319      pass
BLK_D1_FUNC_MIN                      1191320 to 1207167      pass
BLK_D2_FUNC_MIN                      1207168 to 1239743      pass
BLK_D3_FUNC_MIN                      1239744 to 1369391      pass
BLK_E1_FUNC_MIN                      1369392 to 1704319      pass
BLK_E2_FUNC_MIN                      1704320 to 2135047      pass
BLK_E3_FUNC_MIN                      2135048 to 2191079      pass
BLK_E4_FUNC_MIN                      2191080 to 2349191      pass
BLK_F1_FUNC_MIN                      2349192 to 2401743      pass
BLK_F2_FUNC_MIN                      2401744 to 2725007      pass
BLK_H_FUNC_MIN                       2725008 to 2731743      pass
BLK_Q_FUNC_MIN                       2915464 to 2958815      pass
BLK_G_FUNC_MIN                       2890472 to 2901951      pass
Pause in "BLKL1" due to test name
test_name(name="BLKL1")
break> pause fct
break>
Pause in "BLK_L1_FAST_SCAN" due to functional pass
func_test(func_pins = OBPIN, start_vec = 2958816 , stop_vec = 2960439)
break> data off
break> faq
For options 1, 2, and 4 you must already be paused
on the pattern of interest
For option 3 you must be paused on the functional
continuity test.
If you are not paused as required, choose option 5
to exit this menu to get to the required pause
location.
In addition, options 1 and 3 use a user defined pinlist
RMA that is initially set to ALLPIN. You can update
the RMA pinlist by using the interactive pinl command
prior to using options 1 and 3 of this routine.
Note: In many menus if you enter a –1 it will return
you to the test program flow.
Enter a 1 for ATESignature functional pattern analysis.
Enter a 2 for ATEPattern changing analysis.
Enter a 3 for ATECurve tracing analysis.
Enter a 4 for ATESignature scan pattern analysis.
Enter a 5 to return to the program.
Enter your selection: 4
   Enter the pattern start address: 2958816
PLEASE NOTE:
If the analysis is aborted prematurely (ex. cntl C)
the scan pattern will likely be corrupted.
If you log scan failures the run time will increase.
Scan patterns strobe information that was clocked
in in the previous partition. For example: if the
scan pattern is failing partition 12, you need to
```

TABLE 2-continued include partition 11 in the analysis because the
input data on partition 11 is what is causing the
the output failures on partition 12.
Scan patterns strobe information that was clocked
in in the previous partition. For example: if the
scan pattern is failing partition 12, you need to
include partition 11 in the analysis because the
input data on partition 11 is what is causing the
the output failures on partition 12.
   Enter the first partition number for analysis: 40
   Enter the last partition number for analysis: 41
You may choose to use one power setting during the
pattern execution and another at the stop location
when the idd measurement is taken. Of course you
can use the same setting for both.
PS 1 is currently set to 2.500
Enter value to use during the pattern execution: 2.5
Enter value to use the during idd measurement: 2.5
Store the idd current for this supply [0=no, 1=yes]: 1
PS 2 is currently set to 2.500
Enter value to use during the pattern execution: 2.5
Enter value to use the during idd measurement: 2.65
Store the idd current for this supply [0=no, 1=yes]: 1
PS 3 is currently set to 5.001
Enter value to use during the pattern execution: 5
Enter value to use the during idd measurement: 5
Store the idd current for this supply [0=no, 1=yes]: 0
PS 4 is currently set to 4.994
Enter value to use during the pattern execution: 5
Enter value to use the during idd measurement: 5
Store the idd current for this supply [0=no, 1=yes]: 0
PS 5 is currently set to 2.502
Enter value to use during the pattern execution: 2.5
Enter value to use the during idd measurement: 2.65
Store the idd current for this supply [0=no, 1=yes]: 1
PS 6 is currently set to 1.502
Enter value to use during the pattern execution: 1.5
Enter value to use the during idd measurement: 1.5
Store the idd current for this supply [0=no, 1=yes]: 0
PS 7 is currently set to 0.752
Enter value to use during the pattern execution: .75
Enter value to use the during idd measurement: .75
Store the idd current for this supply [0=no, 1=yes]: 0
   MI = Measure Idd Flag
   CV = Current Voltage Setting
   RV = Pattern Run Voltage
   RV = MV = Voltage During Idd Measurement
Your power selections are:
PS 1: MI = 1, CV = 2.500 RV = 2.500 MV = 2.500
PS 2: MI = 1, CV = 2.500 RV = 2.500 MV = 2.650
PS 3: MI = 0, CV = 5.001 RV = 5.000 MV = 5.000
PS 4: MI = 0, CV = 4.994 RV = 5.000 MV = 5.000
PS 5: MI = 1, CV = 2.502 RV = 2.500 MV = 2.650
PS 6: MI = 0, CV = 1.502 RV = 1.500 MV = 1.500
PS 7: MI = 0, CV = 0.752 RV = 0.750 MV = 0.750
   Are these power settings correct [0 = no, 1 = yes:]1
Typically you will float any pins with an X, L, or H
pattern vector character when measuring IDD.
Enter a 1 to float X, L, and H pins.
Enter a 2 to keep them connected to the pin electronics.
Enter your selection: 1
Do not make the file name the same as the program name.
Enter the file name for saving the output:
examplerun.txt
Enter the file name for saving the output: examplerun.txt
The file examplerun.txt has been opened.
Number of scan pins = 2
Tester channel: 28 chain number: 0 pin type: SI index: 0
Tester channel: 22 chain number: 0 pin type: SO index: 1
Processing partition 40 of 41
  Processing Partition:40       Link:0
  Processing Partition:40       Link:1
  Processing Partition:40       Link:2
  Processing Partition:40       Link:3
  Processing Partition:40       Link:4
  Processing Partition:40       Link:5
.
.
.

TABLE 2-continued

```
Processing Partition:40        Link:250
Processing Partition:40        Link:251
Processing Partition:40        Link:252
Processing Partition:40        Link:253
Processing Partition:40        Link:254
Processing Partition:40        Link:255
Processing partition 41 of 41
Processing Partition:41        Link:0
Processing Partition:41        Link:1
Processing Partition:41        Link:2
Processing Partition:41        Link:3
Processing Partition:41        Link:4
Processing Partition:41        Link:5
.
.
.
Processing Partition:41        Link:250
Processing Partition:41        Link:251
Processing Partition:41        Link:252
Processing Partition:41        Link:253
Processing Partition:41        Link:254
Processing Partition:41        Link:255
break>
```

TABLE 4 scansig_ex.txt

Test Date: Sep 1 2004  
Test Time: 10:23:46  
The program name is:   ./cima_scandev  
This test is: BLK_L1_FAST_SCAN  
Tester:    QRT8  
RPS = PS Voltage During Pattern Run  
MPS = PS Voltage During Measurement  
RPS 1 = 2.50 MPS 1 = 2.50  
RPS 2 = 2.50 MPS 2 = 2.65  
RPS 3 = 5.00 MPS 3 = 5.00  
RPS 4 = 5.00 MPS 4 = 5.00  
RPS 5 = 2.50 MPS 5 = 2.65  
RPS 6 = 1.50 MPS 6 = 1.50  
RPS 7 = 0.75 MPS 7 = 0.75

| Partition | Link | Vector | RPS01=2.50 MPS01=2.50 | RPS02=2.50 MPS02=2.65 | RPS05=2.50 MPS05=2.65 |
|---|---|---|---|---|---|
| 40 | 0 | 2959041 | 0.000027 | 0.000042 | 0.002514 |
| 40 | 1 | 2959041 | 0.000031 | 0.000041 | 0.002545 |
| 40 | 2 | 2959041 | 0.000030 | 0.000043 | 0.002607 |
| 40 | 3 | 2959041 | 0.000029 | 0.000040 | 0.002545 |
| 40 | 4 | 2959041 | 0.000028 | 0.000041 | 0.002545 |
| 40 | 5 | 2959041 | 0.000027 | 0.000040 | 0.002576 |
| 40 | 6 | 2959041 | 0.000030 | 0.000042 | 0.002482 |
| 40 | 7 | 2959041 | 0.000028 | 0.000041 | 0.002576 |
| 40 | 8 | 2959041 | 0.000027 | 0.000040 | 0.002545 |
| 40 | 9 | 2959041 | 0.000026 | 0.000040 | 0.002545 |
| 40 | 10 | 2959041 | 0.000025 | 0.000041 | 0.002576 |
| 40 | 11 | 2959041 | 0.000024 | 0.000038 | 0.002576 |
| 40 | 12 | 2959041 | 0.000029 | 0.000042 | 0.002545 |
| 40 | 13 | 2959041 | 0.000033 | 0.000041 | 0.002576 |
| 40 | 14 | 2959041 | 0.000027 | 0.000038 | 0.002545 |
| 40 | 15 | 2959041 | 0.000028 | 0.000044 | 0.002545 |
| 40 | 16 | 2959041 | 0.000027 | 0.000042 | 0.002545 |
| 40 | 17 | 2959041 | 0.000029 | 0.000041 | 0.002545 |
| 40 | 18 | 2959041 | 0.000030 | 0.000041 | 0.002545 |
| 40 | 19 | 2959041 | 0.000027 | 0.000037 | 0.002545 |
| 40 | 20 | 2959041 | 0.000028 | 0.000044 | 0.002545 |
| 40 | 21 | 2959041 | 0.000028 | 0.000042 | 0.002545 |
| 40 | 22 | 2959041 | 0.000028 | 0.000041 | 0.002545 |
| 40 | 23 | 2959041 | 0.000031 | 0.000042 | 0.002482 |
| 40 | 24 | 2959041 | 0.000029 | 0.000041 | 0.002576 |
| 40 | 25 | 2959041 | 0.000028 | 0.000042 | 0.002576 |
| 40 | 26 | 2959041 | 0.000029 | 0.000041 | 0.002576 |
| 40 | 27 | 2959041 | 0.000028 | 0.000039 | 0.002545 |
| 40 | 28 | 2959041 | 0.000029 | 0.000040 | 0.002545 |
| 40 | 29 | 2959041 | 0.000033 | 0.000041 | 0.002576 |
| 40 | 30 | 2959041 | 0.000029 | 0.000039 | 0.002545 |
| 40 | 31 | 2959041 | 0.000028 | 0.000043 | 0.002545 |
| 40 | 32 | 2959041 | 0.000031 | 0.000042 | 0.002545 |
| 40 | 33 | 2959041 | 0.000025 | 0.000041 | 0.002607 |
| 40 | 34 | 2959041 | 0.000031 | 0.000041 | 0.002545 |
| 40 | 35 | 2959041 | 0.000032 | 0.000041 | 0.002576 |
| 40 | 36 | 2959041 | 0.000028 | 0.000038 | 0.002576 |
| 40 | 37 | 2959041 | 0.000029 | 0.000037 | 0.002576 |
| 40 | 38 | 2959041 | 0.000027 | 0.000041 | 0.002576 |
| 40 | 39 | 2959041 | 0.000028 | 0.000043 | 0.002514 |
| 40 | 40 | 2959041 | 0.000029 | 0.000040 | 0.002576 |
| 40 | 41 | 2959041 | 0.000030 | 0.000045 | 0.002545 |
| 40 | 42 | 2959041 | 0.000032 | 0.000042 | 0.002451 |
| 40 | 43 | 2959041 | 0.000030 | 0.000045 | 0.002545 |
| 40 | 44 | 2959041 | 0.000027 | 0.000040 | 0.002576 |
| 40 | 45 | 2959041 | 0.000023 | 0.000038 | 0.002514 |
| 40 | 46 | 2959041 | 0.000027 | 0.000041 | 0.002545 |
| 40 | 47 | 2959041 | 0.000031 | 0.000042 | 0.002545 |
| 40 | 48 | 2959041 | 0.000033 | 0.000042 | 0.002607 |
| 40 | 49 | 2959041 | 0.000028 | 0.000041 | 0.002545 |
| 40 | 50 | 2959041 | 0.000030 | 0.000041 | 0.002545 |
| 40 | 51 | 2959041 | 0.000030 | 0.000042 | 0.002514 |
| 40 | 52 | 2959041 | 0.000029 | 0.000041 | 0.002545 |
| 40 | 53 | 2959041 | 0.000027 | 0.000042 | 0.002545 |

TABLE 4-continued scansig_ex.txt

Test Date: Sep 1 2004
Test Time: 10:23:46
The program name is:       ./cima_scandev
This test is: BLK_L1_FAST_SCAN
Tester:    QRT8
RPS = PS Voltage During Pattern Run
MPS = PS Voltage During Measurement
RPS 1 = 2.50 MPS 1 = 2.50
RPS 2 = 2.50 MPS 2 = 2.65
RPS 3 = 5.00 MPS 3 = 5.00
RPS 4 = 5.00 MPS 4 = 5.00
RPS 5 = 2.50 MPS 5 = 2.65
RPS 6 = 1.50 MPS 6 = 1.50
RPS 7 = 0.75 MPS 7 = 0.75

| Partition | Link | Vector | RPS01=2.50 MPS01=2.50 | RPS02=2.50 MPS02=2.65 | RPS05=2.50 MPS05=2.65 |
|---|---|---|---|---|---|
| 40 | 54 | 2959041 | 0.000029 | 0.000040 | 0.002545 |
| 40 | 55 | 2959041 | 0.000030 | 0.000039 | 0.002576 |
| 40 | 56 | 2959041 | 0.000029 | 0.000043 | 0.002576 |
| 40 | 57 | 2959041 | 0.000028 | 0.000040 | 0.002576 |
| 40 | 58 | 2959041 | 0.000029 | 0.000041 | 0.002545 |
| 40 | 59 | 2959041 | 0.000028 | 0.000042 | 0.002576 |
| 40 | 60 | 2959041 | 0.000027 | 0.000043 | 0.002576 |
| 40 | 61 | 2959041 | 0.000030 | 0.000041 | 0.002576 |
| 40 | 62 | 2959041 | 0.000031 | 0.000042 | 0.002576 |
| 40 | 63 | 2959041 | 0.000029 | 0.000042 | 0.002576 |
| 40 | 64 | 2959041 | 0.000029 | 0.000041 | 0.002545 |
| 40 | 65 | 2959041 | 0.000030 | 0.000043 | 0.002545 |
| 40 | 66 | 2959041 | 0.000029 | 0.000037 | 0.002576 |
| 40 | 67 | 2959041 | 0.000029 | 0.000040 | 0.002545 |
| 40 | 68 | 2959041 | 0.000029 | 0.000040 | 0.002576 |
| 40 | 69 | 2959041 | 0.000031 | 0.000040 | 0.002576 |
| 40 | 70 | 2959041 | 0.000029 | 0.000042 | 0.002545 |
| 40 | 71 | 2959041 | 0.000030 | 0.000042 | 0.002545 |
| 40 | 72 | 2959041 | 0.000030 | 0.000041 | 0.002545 |
| 40 | 73 | 2959041 | 0.000029 | 0.000041 | 0.002576 |
| 40 | 74 | 2959041 | 0.000028 | 0.000042 | 0.002576 |
| 40 | 75 | 2959041 | 0.000028 | 0.000039 | 0.002545 |
| 40 | 76 | 2959041 | 0.000030 | 0.000040 | 0.002607 |
| 40 | 77 | 2959041 | 0.000025 | 0.000041 | 0.002607 |
| 40 | 78 | 2959041 | 0.000026 | 0.000036 | 0.002545 |
| 40 | 79 | 2959041 | 0.000025 | 0.000042 | 0.002576 |
| 40 | 80 | 2959041 | 0.000032 | 0.000040 | 0.002576 |
| 40 | 81 | 2959041 | 0.000029 | 0.000040 | 0.002576 |
| 40 | 82 | 2959041 | 0.000028 | 0.000042 | 0.002607 |
| 40 | 83 | 2959041 | 0.000029 | 0.000041 | 0.002545 |
| 40 | 84 | 2959041 | 0.000029 | 0.000042 | 0.002576 |
| 40 | 85 | 2959041 | 0.000028 | 0.000041 | 0.002545 |
| 40 | 86 | 2959041 | 0.000030 | 0.000041 | 0.002576 |
| 40 | 87 | 2959041 | 0.000033 | 0.000042 | 0.002576 |
| 40 | 88 | 2959041 | 0.000028 | 0.000039 | 0.002576 |
| 40 | 89 | 2959041 | 0.000029 | 0.000040 | 0.002576 |
| 40 | 90 | 2959041 | 0.000031 | 0.000041 | 0.002545 |
| 40 | 91 | 2959041 | 0.000027 | 0.000042 | 0.002576 |
| 40 | 92 | 2959041 | 0.000027 | 0.000039 | 0.002576 |
| 40 | 93 | 2959041 | 0.000027 | 0.000039 | 0.002514 |
| 40 | 94 | 2959041 | 0.000026 | 0.000038 | 0.002545 |
| 40 | 95 | 2959041 | 0.000030 | 0.000041 | 0.002638 |
| 40 | 96 | 2959041 | 0.000030 | 0.000043 | 0.002576 |
| 40 | 97 | 2959041 | 0.000032 | 0.000042 | 0.002482 |
| 40 | 98 | 2959041 | 0.000029 | 0.000040 | 0.002482 |
| 40 | 99 | 2959041 | 0.000027 | 0.000040 | 0.002576 |
| 40 | 100 | 2959041 | 0.000030 | 0.000040 | 0.002545 |
| 40 | 101 | 2959041 | 0.000028 | 0.000042 | 0.002545 |
| 40 | 102 | 2959041 | 0.000027 | 0.000042 | 0.002576 |
| 40 | 103 | 2959041 | 0.000027 | 0.000039 | 0.002576 |
| 40 | 104 | 2959041 | 0.000029 | 0.000039 | 0.002545 |
| 40 | 105 | 2959041 | 0.000030 | 0.000040 | 0.002576 |
| 40 | 106 | 2959041 | 0.000028 | 0.000042 | 0.002514 |
| 40 | 107 | 2959041 | 0.000028 | 0.000041 | 0.002576 |
| 40 | 108 | 2959041 | 0.000028 | 0.000041 | 0.002545 |
| 40 | 109 | 2959041 | 0.000024 | 0.000038 | 0.002576 |
| 40 | 110 | 2959041 | 0.000029 | 0.000038 | 0.002576 |
| 40 | 111 | 2959041 | 0.000031 | 0.000042 | 0.002576 |
| 40 | 112 | 2959041 | 0.000030 | 0.000040 | 0.002576 |
| 40 | 113 | 2959041 | 0.000030 | 0.000042 | 0.002576 |
| 40 | 114 | 2959041 | 0.000029 | 0.000037 | 0.002545 |
| 40 | 115 | 2959041 | 0.000029 | 0.000042 | 0.002576 |
| 40 | 116 | 2959041 | 0.000030 | 0.000040 | 0.002576 |
| 40 | 117 | 2959041 | 0.000028 | 0.000040 | 0.002545 |
| 40 | 118 | 2959041 | 0.000026 | 0.000038 | 0.002576 |
| 40 | 119 | 2959041 | 0.000027 | 0.000042 | 0.002576 |
| 40 | 120 | 2959041 | 0.000026 | 0.000042 | 0.002576 |
| 40 | 121 | 2959041 | 0.000028 | 0.000041 | 0.002514 |
| 40 | 122 | 2959041 | 0.000026 | 0.000042 | 0.002545 |
| 40 | 123 | 2959041 | 0.000029 | 0.000042 | 0.002576 |
| 40 | 124 | 2959041 | 0.000028 | 0.000040 | 0.002576 |
| 40 | 125 | 2959041 | 0.000029 | 0.000043 | 0.002576 |
| 40 | 126 | 2959041 | 0.000030 | 0.000045 | 0.002576 |
| 40 | 127 | 2959041 | 0.000028 | 0.000041 | 0.002545 |
| 40 | 128 | 2959041 | 0.000031 | 0.000038 | 0.002545 |
| 40 | 129 | 2959041 | 0.000030 | 0.000041 | 0.002576 |
| 40 | 130 | 2959041 | 0.000030 | 0.000042 | 0.002576 |
| 40 | 131 | 2959041 | 0.000030 | 0.000041 | 0.002545 |
| 40 | 132 | 2959041 | 0.000027 | 0.000040 | 0.002576 |
| 40 | 133 | 2959041 | 0.000030 | 0.000039 | 0.002576 |
| 40 | 134 | 2959041 | 0.000028 | 0.000040 | 0.002514 |
| 40 | 135 | 2959041 | 0.000028 | 0.000041 | 0.002482 |
| 40 | 136 | 2959041 | 0.000033 | 0.000040 | 0.002514 |
| 40 | 137 | 2959041 | 0.000028 | 0.000043 | 0.002576 |
| 40 | 138 | 2959041 | 0.000028 | 0.000042 | 0.002514 |
| 40 | 139 | 2959041 | 0.000028 | 0.000039 | 0.002576 |
| 40 | 140 | 2959041 | 0.000023 | 0.000041 | 0.002638 |
| 40 | 141 | 2959041 | 0.000030 | 0.000042 | 0.002545 |
| 40 | 142 | 2959041 | 0.000027 | 0.000042 | 0.002576 |
| 40 | 143 | 2959041 | 0.000027 | 0.000042 | 0.002576 |
| 40 | 144 | 2959041 | 0.000032 | 0.000042 | 0.002514 |
| 40 | 145 | 2959041 | 0.000029 | 0.000040 | 0.002576 |
| 40 | 146 | 2959041 | 0.000029 | 0.000041 | 0.002576 |
| 40 | 147 | 2959041 | 0.000031 | 0.000043 | 0.002514 |
| 40 | 148 | 2959041 | 0.000021 | 0.000041 | 0.002514 |
| 40 | 149 | 2959041 | 0.000029 | 0.000040 | 0.002576 |
| 40 | 150 | 2959041 | 0.000029 | 0.000042 | 0.002576 |
| 40 | 151 | 2959041 | 0.000029 | 0.000040 | 0.002576 |
| 40 | 152 | 2959041 | 0.000029 | 0.000042 | 0.002576 |
| 40 | 153 | 2959041 | 0.000027 | 0.000043 | 0.002607 |
| 40 | 154 | 2959041 | 0.000029 | 0.000040 | 0.002576 |
| 40 | 155 | 2959041 | 0.000028 | 0.000040 | 0.002576 |
| 40 | 156 | 2959041 | 0.000031 | 0.000043 | 0.002607 |
| 40 | 157 | 2959041 | 0.000028 | 0.000040 | 0.002545 |
| 40 | 158 | 2959041 | 0.000029 | 0.000042 | 0.002576 |
| 40 | 159 | 2959041 | 0.000029 | 0.000043 | 0.002576 |
| 40 | 160 | 2959041 | 0.000030 | 0.000039 | 0.002545 |
| 40 | 161 | 2959041 | 0.000026 | 0.000042 | 0.002576 |
| 40 | 162 | 2959041 | 0.000030 | 0.000042 | 0.002545 |
| 40 | 163 | 2959041 | 0.000029 | 0.000042 | 0.002607 |
| 40 | 164 | 2959041 | 0.000032 | 0.000041 | 0.002514 |
| 40 | 165 | 2959041 | 0.000026 | 0.000038 | 0.002576 |
| 40 | 166 | 2959041 | 0.000029 | 0.000042 | 0.002545 |
| 40 | 167 | 2959041 | 0.000029 | 0.000041 | 0.002607 |
| 40 | 168 | 2959041 | 0.000028 | 0.000041 | 0.002545 |
| 40 | 169 | 2959041 | 0.000027 | 0.000041 | 0.002545 |
| 40 | 170 | 2959041 | 0.000030 | 0.000039 | 0.002576 |
| 40 | 171 | 2959041 | 0.000028 | 0.000039 | 0.002576 |
| 40 | 172 | 2959041 | 0.000028 | 0.000042 | 0.002576 |
| 40 | 173 | 2959041 | 0.000033 | 0.000042 | 0.002607 |
| 40 | 174 | 2959041 | 0.000029 | 0.000041 | 0.002545 |
| 40 | 175 | 2959041 | 0.000030 | 0.000045 | 0.002545 |

TABLE 4-continued scansig_ex.txt

Test Date: Sep 1 2004  
Test Time: 10:23:46  
The program name is: ./cima_scandev  
This test is: BLK_L1_FAST_SCAN  
Tester: QRT8  
RPS = PS Voltage During Pattern Run  
MPS = PS Voltage During Measurement  
RPS 1 = 2.50 MPS 1 = 2.50  
RPS 2 = 2.50 MPS 2 = 2.65  
RPS 3 = 5.00 MPS 3 = 5.00  
RPS 4 = 5.00 MPS 4 = 5.00  
RPS 5 = 2.50 MPS 5 = 2.65  
RPS 6 = 1.50 MPS 6 = 1.50  
RPS 7 = 0.75 MPS 7 = 0.75

| Partition | Link | Vector | RPS01=2.50 MPS01=2.50 | RPS02=2.50 MPS02=2.65 | RPS05=2.50 MPS05=2.65 |
|---|---|---|---|---|---|
| 40 | 176 | 2959041 | 0.000030 | 0.000041 | 0.002545 |
| 40 | 177 | 2959041 | 0.000029 | 0.000040 | 0.002576 |
| 40 | 178 | 2959041 | 0.000027 | 0.000038 | 0.002607 |
| 40 | 179 | 2959041 | 0.000027 | 0.000038 | 0.002545 |
| 40 | 180 | 2959041 | 0.000030 | 0.000045 | 0.002545 |
| 40 | 181 | 2959041 | 0.000025 | 0.000041 | 0.002545 |
| 40 | 182 | 2959041 | 0.000024 | 0.000039 | 0.002451 |
| 40 | 183 | 2959041 | 0.000028 | 0.000041 | 0.002545 |
| 40 | 184 | 2959041 | 0.000027 | 0.000041 | 0.002545 |
| 40 | 185 | 2959041 | 0.000028 | 0.000040 | 0.002576 |
| 40 | 186 | 2959041 | 0.000028 | 0.000042 | 0.002576 |
| 40 | 187 | 2959041 | 0.000027 | 0.000036 | 0.002514 |
| 40 | 188 | 2959041 | 0.000027 | 0.000042 | 0.002576 |
| 40 | 189 | 2959041 | 0.000028 | 0.000041 | 0.002545 |
| 40 | 190 | 2959041 | 0.000031 | 0.000040 | 0.002576 |
| 40 | 191 | 2959041 | 0.000029 | 0.000040 | 0.002576 |
| 40 | 192 | 2959041 | 0.000026 | 0.000041 | 0.002545 |
| 40 | 193 | 2959041 | 0.000029 | 0.000040 | 0.002576 |
| 40 | 194 | 2959041 | 0.000027 | 0.000038 | 0.002576 |
| 40 | 195 | 2959041 | 0.000031 | 0.000042 | 0.002576 |
| 40 | 196 | 2959041 | 0.000027 | 0.000040 | 0.002576 |
| 40 | 197 | 2959041 | 0.000031 | 0.000040 | 0.002545 |
| 40 | 198 | 2959041 | 0.000029 | 0.000037 | 0.002545 |
| 40 | 199 | 2959041 | 0.000027 | 0.000040 | 0.002576 |
| 40 | 200 | 2959041 | 0.000027 | 0.000040 | 0.002514 |
| 40 | 201 | 2959041 | 0.000027 | 0.000041 | 0.002607 |
| 40 | 202 | 2959041 | 0.000030 | 0.000037 | 0.002576 |
| 40 | 203 | 2959041 | 0.000031 | 0.000040 | 0.002576 |
| 40 | 204 | 2959041 | 0.000028 | 0.000040 | 0.002545 |
| 40 | 205 | 2959041 | 0.000027 | 0.000042 | 0.002576 |
| 40 | 206 | 2959041 | 0.000028 | 0.000040 | 0.002545 |
| 40 | 207 | 2959041 | 0.000028 | 0.000042 | 0.002576 |
| 40 | 208 | 2959041 | 0.000029 | 0.000042 | 0.002576 |
| 40 | 209 | 2959041 | 0.000029 | 0.000039 | 0.002545 |
| 40 | 210 | 2959041 | 0.000027 | 0.000040 | 0.002545 |
| 40 | 211 | 2959041 | 0.000027 | 0.000040 | 0.002545 |
| 40 | 212 | 2959041 | 0.000032 | 0.000042 | 0.002545 |
| 40 | 213 | 2959041 | 0.000029 | 0.000040 | 0.002576 |
| 40 | 214 | 2959041 | 0.000027 | 0.000041 | 0.002545 |
| 40 | 215 | 2959041 | 0.000029 | 0.000040 | 0.002576 |
| 40 | 216 | 2959041 | 0.000030 | 0.000045 | 0.002545 |
| 40 | 217 | 2959041 | 0.000033 | 0.000041 | 0.002576 |
| 40 | 218 | 2959041 | 0.000030 | 0.000043 | 0.002638 |
| 40 | 219 | 2959041 | 0.000025 | 0.000046 | 0.002545 |
| 40 | 220 | 2959041 | 0.000028 | 0.000042 | 0.002576 |
| 40 | 221 | 2959041 | 0.000030 | 0.000043 | 0.002545 |
| 40 | 222 | 2959041 | 0.000033 | 0.000042 | 0.002607 |
| 40 | 223 | 2959041 | 0.000031 | 0.000042 | 0.002482 |
| 40 | 224 | 2959041 | 0.000027 | 0.000040 | 0.002545 |
| 40 | 225 | 2959041 | 0.000031 | 0.000042 | 0.002545 |
| 40 | 226 | 2959041 | 0.000028 | 0.000040 | 0.002576 |
| 40 | 227 | 2959041 | 0.000028 | 0.000041 | 0.002576 |
| 40 | 228 | 2959041 | 0.000027 | 0.000041 | 0.002545 |
| 40 | 229 | 2959041 | 0.000030 | 0.000039 | 0.002545 |
| 40 | 230 | 2959041 | 0.000030 | 0.000044 | 0.002545 |
| 40 | 231 | 2959041 | 0.000028 | 0.000041 | 0.002576 |
| 40 | 232 | 2959041 | 0.000033 | 0.000038 | 0.002545 |
| 40 | 233 | 2959041 | 0.000025 | 0.000040 | 0.002545 |
| 40 | 234 | 2959041 | 0.000027 | 0.000037 | 0.002576 |
| 40 | 235 | 2959041 | 0.000030 | 0.000041 | 0.002576 |
| 40 | 236 | 2959041 | 0.000027 | 0.000042 | 0.002514 |
| 40 | 237 | 2959041 | 0.000027 | 0.000039 | 0.002545 |
| 40 | 238 | 2959041 | 0.000030 | 0.000043 | 0.002638 |
| 40 | 239 | 2959041 | 0.000026 | 0.000038 | 0.002545 |
| 40 | 240 | 2959041 | 0.000028 | 0.000041 | 0.002545 |
| 40 | 241 | 2959041 | 0.000030 | 0.000040 | 0.002545 |
| 40 | 242 | 2959041 | 0.000028 | 0.000040 | 0.002545 |
| 40 | 243 | 2959041 | 0.000028 | 0.000042 | 0.002545 |
| 40 | 244 | 2959041 | 0.000027 | 0.000041 | 0.002576 |
| 40 | 245 | 2959041 | 0.000032 | 0.000040 | 0.002576 |
| 40 | 246 | 2959041 | 0.000028 | 0.000042 | 0.002545 |
| 40 | 247 | 2959041 | 0.000028 | 0.000042 | 0.002576 |
| 40 | 248 | 2959041 | 0.000028 | 0.000041 | 0.002545 |
| 40 | 249 | 2959041 | 0.000028 | 0.000040 | 0.002514 |
| 40 | 250 | 2959041 | 0.000027 | 0.000041 | 0.002576 |
| 40 | 251 | 2959041 | 0.000027 | 0.000040 | 0.002545 |
| 40 | 252 | 2959041 | 0.000028 | 0.000041 | 0.002545 |
| 40 | 253 | 2959041 | 0.000026 | 0.000040 | 0.003945 |
| 40 | 254 | 2959041 | 0.000028 | 0.000039 | 0.004039 |
| 40 | 255 | 2959041 | 0.000025 | 0.000042 | 0.003977 |
| 41 | 0 | 2959046 | 0.000031 | 0.000041 | 0.003977 |
| 41 | 1 | 2959046 | 0.000027 | 0.000042 | 0.003977 |
| 41 | 2 | 2959046 | 0.000029 | 0.000039 | 0.003977 |
| 41 | 3 | 2959046 | 0.000029 | 0.000042 | 0.003945 |
| 41 | 4 | 2959046 | 0.000028 | 0.000040 | 0.003945 |
| 41 | 5 | 2959046 | 0.000026 | 0.000041 | 0.003977 |
| 41 | 6 | 2959046 | 0.000026 | 0.000043 | 0.003977 |
| 41 | 7 | 2959046 | 0.000027 | 0.000039 | 0.003977 |
| 41 | 8 | 2959046 | 0.000027 | 0.000043 | 0.003977 |
| 41 | 9 | 2959046 | 0.000032 | 0.000042 | 0.003945 |
| 41 | 10 | 2959046 | 0.000026 | 0.000039 | 0.003977 |
| 41 | 11 | 2959046 | 0.000029 | 0.000042 | 0.003977 |
| 41 | 12 | 2959046 | 0.000031 | 0.000040 | 0.004008 |
| 41 | 13 | 2959046 | 0.000028 | 0.000041 | 0.003977 |
| 41 | 14 | 2959046 | 0.000028 | 0.000039 | 0.003977 |
| 41 | 15 | 2959046 | 0.000027 | 0.000040 | 0.003977 |
| 41 | 16 | 2959046 | 0.000030 | 0.000041 | 0.003977 |
| 41 | 17 | 2959046 | 0.000029 | 0.000038 | 0.003977 |
| 41 | 18 | 2959046 | 0.000025 | 0.000041 | 0.003977 |
| 41 | 19 | 2959046 | 0.000031 | 0.000042 | 0.004008 |
| 41 | 20 | 2959046 | 0.000027 | 0.000039 | 0.003977 |
| 41 | 21 | 2959046 | 0.000031 | 0.000040 | 0.003977 |
| 41 | 22 | 2959046 | 0.000030 | 0.000039 | 0.003914 |
| 41 | 23 | 2959046 | 0.000026 | 0.000037 | 0.003977 |
| 41 | 24 | 2959046 | 0.000028 | 0.000040 | 0.004008 |
| 41 | 25 | 2959046 | 0.000029 | 0.000042 | 0.003977 |
| 41 | 26 | 2959046 | 0.000031 | 0.000038 | 0.003977 |
| 41 | 27 | 2959046 | 0.000028 | 0.000041 | 0.003977 |
| 41 | 28 | 2959046 | 0.000029 | 0.000042 | 0.004008 |
| 41 | 29 | 2959046 | 0.000028 | 0.000038 | 0.003977 |
| 41 | 30 | 2959046 | 0.000027 | 0.000042 | 0.004008 |
| 41 | 31 | 2959046 | 0.000027 | 0.000042 | 0.003977 |
| 41 | 32 | 2959046 | 0.000029 | 0.000043 | 0.003977 |
| 41 | 33 | 2959046 | 0.000028 | 0.000042 | 0.003977 |
| 41 | 34 | 2959046 | 0.000026 | 0.000043 | 0.003977 |
| 41 | 35 | 2959046 | 0.000029 | 0.000042 | 0.003945 |
| 41 | 36 | 2959046 | 0.000031 | 0.000041 | 0.003945 |
| 41 | 37 | 2959046 | 0.000027 | 0.000040 | 0.003945 |
| 41 | 38 | 2959046 | 0.000028 | 0.000041 | 0.003977 |
| 41 | 39 | 2959046 | 0.000030 | 0.000041 | 0.003914 |
| 41 | 40 | 2959046 | 0.000031 | 0.000041 | 0.003914 |
| 41 | 41 | 2959046 | 0.000026 | 0.000040 | 0.004039 |

TABLE 4-continued scansig_ex.txt

Test Date: Sep 1 2004
Test Time: 10:23:46
The program name is:     ./cima_scandev
This test is: BLK_L1_FAST_SCAN
Tester:    QRT8
RPS = PS Voltage During Pattern Run
MPS = PS Voltage During Measurement
RPS 1 = 2.50 MPS 1 = 2.50
RPS 2 = 2.50 MPS 2 = 2.65
RPS 3 = 5.00 MPS 3 = 5.00
RPS 4 = 5.00 MPS 4 = 5.00
RPS 5 = 2.50 MPS 5 = 2.65
RPS 6 = 1.50 MPS 6 = 1.50
RPS 7 = 0.75 MPS 7 = 0.75

| Partition | Link | Vector | RPS01=2.50 MPS01=2.50 | RPS02=2.50 MPS02=2.65 | RPS05=2.50 MPS05=2.65 |
|---|---|---|---|---|---|
| 41 | 42 | 2959046 | 0.000028 | 0.000041 | 0.003977 |
| 41 | 43 | 2959046 | 0.000031 | 0.000040 | 0.003977 |
| 41 | 44 | 2959046 | 0.000025 | 0.000042 | 0.003977 |
| 41 | 45 | 2959046 | 0.000026 | 0.000040 | 0.004008 |
| 41 | 46 | 2959046 | 0.000028 | 0.000040 | 0.004008 |
| 41 | 47 | 2959046 | 0.000029 | 0.000042 | 0.004008 |
| 41 | 48 | 2959046 | 0.000029 | 0.000042 | 0.003945 |
| 41 | 49 | 2959046 | 0.000028 | 0.000041 | 0.003977 |
| 41 | 50 | 2959046 | 0.000027 | 0.000040 | 0.003977 |
| 41 | 51 | 2959046 | 0.000027 | 0.000041 | 0.003945 |
| 41 | 52 | 2959046 | 0.000029 | 0.000041 | 0.003914 |
| 41 | 53 | 2959046 | 0.000028 | 0.000042 | 0.003977 |
| 41 | 54 | 2959046 | 0.000029 | 0.000040 | 0.003977 |
| 41 | 55 | 2959046 | 0.000027 | 0.000040 | 0.004039 |
| 41 | 56 | 2959046 | 0.000029 | 0.000044 | 0.003945 |
| 41 | 57 | 2959046 | 0.000029 | 0.000040 | 0.003977 |
| 41 | 58 | 2959046 | 0.000030 | 0.000039 | 0.003945 |
| 41 | 59 | 2959046 | 0.000029 | 0.000041 | 0.003977 |
| 41 | 60 | 2959046 | 0.000029 | 0.000044 | 0.003977 |
| 41 | 61 | 2959046 | 0.000031 | 0.000042 | 0.003977 |
| 41 | 62 | 2959046 | 0.000027 | 0.000042 | 0.004008 |
| 41 | 63 | 2959046 | 0.000027 | 0.000039 | 0.003977 |
| 41 | 64 | 2959046 | 0.000032 | 0.000038 | 0.004039 |
| 41 | 65 | 2959046 | 0.000028 | 0.000038 | 0.004039 |
| 41 | 66 | 2959046 | 0.000027 | 0.000039 | 0.003977 |
| 41 | 67 | 2959046 | 0.000026 | 0.000041 | 0.003977 |
| 41 | 68 | 2959046 | 0.000031 | 0.000044 | 0.003977 |
| 41 | 69 | 2959046 | 0.000029 | 0.000040 | 0.003977 |
| 41 | 70 | 2959046 | 0.000028 | 0.000042 | 0.003945 |
| 41 | 71 | 2959046 | 0.000027 | 0.000044 | 0.004008 |
| 41 | 72 | 2959046 | 0.000027 | 0.000046 | 0.003977 |
| 41 | 73 | 2959046 | 0.000028 | 0.000039 | 0.003977 |
| 41 | 74 | 2959046 | 0.000028 | 0.000041 | 0.003945 |
| 41 | 75 | 2959046 | 0.000027 | 0.000039 | 0.004008 |
| 41 | 76 | 2959046 | 0.000030 | 0.000039 | 0.003977 |
| 41 | 77 | 2959046 | 0.000030 | 0.000037 | 0.003977 |
| 41 | 78 | 2959046 | 0.000027 | 0.000040 | 0.003977 |
| 41 | 79 | 2959046 | 0.000027 | 0.000041 | 0.003945 |
| 41 | 80 | 2959046 | 0.000024 | 0.000042 | 0.003977 |
| 41 | 81 | 2959046 | 0.000027 | 0.000042 | 0.003977 |
| 41 | 82 | 2959046 | 0.000028 | 0.000042 | 0.004008 |
| 41 | 83 | 2959046 | 0.000027 | 0.000039 | 0.003977 |
| 41 | 84 | 2959046 | 0.000027 | 0.000042 | 0.003977 |
| 41 | 85 | 2959046 | 0.000027 | 0.000041 | 0.003977 |
| 41 | 86 | 2959046 | 0.000030 | 0.000042 | 0.003977 |
| 41 | 87 | 2959046 | 0.000029 | 0.000044 | 0.003945 |
| 41 | 88 | 2959046 | 0.000027 | 0.000041 | 0.003977 |
| 41 | 89 | 2959046 | 0.000030 | 0.000041 | 0.003977 |
| 41 | 90 | 2959046 | 0.000028 | 0.000041 | 0.003977 |
| 41 | 91 | 2959046 | 0.000028 | 0.000038 | 0.004008 |
| 41 | 92 | 2959046 | 0.000030 | 0.000040 | 0.003977 |
| 41 | 93 | 2959046 | 0.000027 | 0.000039 | 0.004008 |
| 41 | 94 | 2959046 | 0.000028 | 0.000040 | 0.003977 |
| 41 | 95 | 2959046 | 0.000029 | 0.000042 | 0.004039 |
| 41 | 96 | 2959046 | 0.000025 | 0.000039 | 0.003977 |
| 41 | 97 | 2959046 | 0.000030 | 0.000041 | 0.003945 |
| 41 | 98 | 2959046 | 0.000027 | 0.000040 | 0.004039 |
| 41 | 99 | 2959046 | 0.000028 | 0.000042 | 0.003977 |
| 41 | 100 | 2959046 | 0.000028 | 0.000041 | 0.003977 |
| 41 | 101 | 2959046 | 0.000027 | 0.000041 | 0.003977 |
| 41 | 102 | 2959046 | 0.000029 | 0.000043 | 0.003977 |
| 41 | 103 | 2959046 | 0.000028 | 0.000041 | 0.003945 |
| 41 | 104 | 2959046 | 0.000028 | 0.000042 | 0.003977 |
| 41 | 105 | 2959046 | 0.000027 | 0.000044 | 0.003945 |
| 41 | 106 | 2959046 | 0.000027 | 0.000040 | 0.003945 |
| 41 | 107 | 2959046 | 0.000029 | 0.000038 | 0.003977 |
| 41 | 108 | 2959046 | 0.000030 | 0.000040 | 0.003945 |
| 41 | 109 | 2959046 | 0.000027 | 0.000041 | 0.004008 |
| 41 | 110 | 2959046 | 0.000029 | 0.000040 | 0.003977 |
| 41 | 111 | 2959046 | 0.000028 | 0.000042 | 0.004008 |
| 41 | 112 | 2959046 | 0.000029 | 0.000040 | 0.003977 |
| 41 | 113 | 2959046 | 0.000030 | 0.000043 | 0.003977 |
| 41 | 114 | 2959046 | 0.000029 | 0.000041 | 0.003977 |
| 41 | 115 | 2959046 | 0.000029 | 0.000040 | 0.003977 |
| 41 | 116 | 2959046 | 0.000027 | 0.000041 | 0.003977 |
| 41 | 117 | 2959046 | 0.000026 | 0.000040 | 0.003977 |
| 41 | 118 | 2959046 | 0.000028 | 0.000040 | 0.003977 |
| 41 | 119 | 2959046 | 0.000029 | 0.000039 | 0.003977 |
| 41 | 120 | 2959046 | 0.000027 | 0.000041 | 0.003977 |
| 41 | 121 | 2959046 | 0.000030 | 0.000042 | 0.003977 |
| 41 | 122 | 2959046 | 0.000030 | 0.000042 | 0.003977 |
| 41 | 123 | 2959046 | 0.000032 | 0.000042 | 0.004008 |
| 41 | 124 | 2959046 | 0.000032 | 0.000041 | 0.003977 |
| 41 | 125 | 2959046 | 0.000031 | 0.000043 | 0.004039 |
| 41 | 126 | 2959046 | 0.000031 | 0.000040 | 0.003977 |
| 41 | 127 | 2959046 | 0.000027 | 0.000042 | 0.003977 |
| 41 | 128 | 2959046 | 0.000029 | 0.000040 | 0.003977 |
| 41 | 129 | 2959046 | 0.000027 | 0.000040 | 0.003945 |
| 41 | 130 | 2959046 | 0.000027 | 0.000041 | 0.003977 |
| 41 | 131 | 2959046 | 0.000027 | 0.000041 | 0.004008 |
| 41 | 132 | 2959046 | 0.000029 | 0.000042 | 0.003977 |
| 41 | 133 | 2959046 | 0.000031 | 0.000037 | 0.004008 |
| 41 | 134 | 2959046 | 0.000031 | 0.000039 | 0.003977 |
| 41 | 135 | 2959046 | 0.000025 | 0.000041 | 0.003945 |
| 41 | 136 | 2959046 | 0.000028 | 0.000039 | 0.003977 |
| 41 | 137 | 2959046 | 0.000029 | 0.000042 | 0.003945 |
| 41 | 138 | 2959046 | 0.000026 | 0.000040 | 0.003945 |
| 41 | 139 | 2959046 | 0.000029 | 0.000042 | 0.004008 |
| 41 | 140 | 2959046 | 0.000027 | 0.000042 | 0.003977 |
| 41 | 141 | 2959046 | 0.000027 | 0.000038 | 0.003977 |
| 41 | 142 | 2959046 | 0.000031 | 0.000039 | 0.003977 |
| 41 | 143 | 2959046 | 0.000028 | 0.000045 | 0.004008 |
| 41 | 144 | 2959046 | 0.000028 | 0.000041 | 0.003977 |
| 41 | 145 | 2959046 | 0.000029 | 0.000041 | 0.003977 |
| 41 | 146 | 2959046 | 0.000028 | 0.000045 | 0.003977 |
| 41 | 147 | 2959046 | 0.000031 | 0.000041 | 0.003977 |
| 41 | 148 | 2959046 | 0.000029 | 0.000041 | 0.003945 |
| 41 | 149 | 2959046 | 0.000029 | 0.000040 | 0.004008 |
| 41 | 150 | 2959046 | 0.000029 | 0.000039 | 0.003945 |
| 41 | 151 | 2959046 | 0.000025 | 0.000041 | 0.003945 |
| 41 | 152 | 2959046 | 0.000031 | 0.000044 | 0.003977 |
| 41 | 153 | 2959046 | 0.000027 | 0.000040 | 0.003945 |
| 41 | 154 | 2959046 | 0.000029 | 0.000041 | 0.003945 |
| 41 | 155 | 2959046 | 0.000029 | 0.000038 | 0.003914 |
| 41 | 156 | 2959046 | 0.000029 | 0.000042 | 0.004008 |
| 41 | 157 | 2959046 | 0.000027 | 0.000037 | 0.003977 |
| 41 | 158 | 2959046 | 0.000027 | 0.000039 | 0.003977 |
| 41 | 159 | 2959046 | 0.000028 | 0.000037 | 0.003977 |
| 41 | 160 | 2959046 | 0.000030 | 0.000042 | 0.003977 |
| 41 | 161 | 2959046 | 0.000033 | 0.000040 | 0.003977 |
| 41 | 162 | 2959046 | 0.000028 | 0.000041 | 0.003977 |
| 41 | 163 | 2959046 | 0.000029 | 0.000042 | 0.003977 |

TABLE 4-continued scansig_ex.txt

Test Date: Sep 1 2004
Test Time: 10:23:46
The program name is: ./cima_scandev
This test is: BLK_L1_FAST_SCAN
Tester: QRT8
RPS = PS Voltage During Pattern Run
MPS = PS Voltage During Measurement
RPS 1 = 2.50 MPS 1 = 2.50
RPS 2 = 2.50 MPS 2 = 2.65
RPS 3 = 5.00 MPS 3 = 5.00
RPS 4 = 5.00 MPS 4 = 5.00
RPS 5 = 2.50 MPS 5 = 2.65
RPS 6 = 1.50 MPS 6 = 1.50
RPS 7 = 0.75 MPS 7 = 0.75

| Partition | Link | Vector | RPS01=2.50 MPS01=2.50 | RPS02=2.50 MPS02=2.65 | RPS05=2.50 MPS05=2.65 |
|---|---|---|---|---|---|
| 41 | 164 | 2959046 | 0.000027 | 0.000040 | 0.003977 |
| 41 | 165 | 2959046 | 0.000025 | 0.000040 | 0.003945 |
| 41 | 166 | 2959046 | 0.000029 | 0.000041 | 0.003977 |
| 41 | 167 | 2959046 | 0.000026 | 0.000041 | 0.003977 |
| 41 | 168 | 2959046 | 0.000030 | 0.000041 | 0.003914 |
| 41 | 169 | 2959046 | 0.000027 | 0.000041 | 0.003945 |
| 41 | 170 | 2959046 | 0.000028 | 0.000042 | 0.003977 |
| 41 | 171 | 2959046 | 0.000028 | 0.000040 | 0.003977 |
| 41 | 172 | 2959046 | 0.000031 | 0.000038 | 0.003977 |
| 41 | 173 | 2959046 | 0.000027 | 0.000040 | 0.004039 |
| 41 | 174 | 2959046 | 0.000026 | 0.000038 | 0.003977 |
| 41 | 175 | 2959046 | 0.000028 | 0.000040 | 0.004008 |
| 41 | 176 | 2959046 | 0.000028 | 0.000041 | 0.003977 |
| 41 | 177 | 2959046 | 0.000032 | 0.000040 | 0.003977 |
| 41 | 178 | 2959046 | 0.000028 | 0.000042 | 0.004008 |
| 41 | 179 | 2959046 | 0.000029 | 0.000042 | 0.003977 |
| 41 | 180 | 2959046 | 0.000029 | 0.000042 | 0.003977 |
| 41 | 181 | 2959046 | 0.000028 | 0.000040 | 0.003945 |
| 41 | 182 | 2959046 | 0.000030 | 0.000040 | 0.003977 |
| 41 | 183 | 2959046 | 0.000028 | 0.000040 | 0.003977 |
| 41 | 184 | 2959046 | 0.000023 | 0.000041 | 0.003914 |
| 41 | 185 | 2959046 | 0.000033 | 0.000043 | 0.003914 |
| 41 | 186 | 2959046 | 0.000030 | 0.000041 | 0.003977 |
| 41 | 187 | 2959046 | 0.000027 | 0.000042 | 0.003914 |
| 41 | 188 | 2959046 | 0.000027 | 0.000042 | 0.003977 |
| 41 | 189 | 2959046 | 0.000030 | 0.000042 | 0.003977 |
| 41 | 190 | 2959046 | 0.000029 | 0.000042 | 0.004008 |
| 41 | 191 | 2959046 | 0.000028 | 0.000042 | 0.003977 |
| 41 | 192 | 2959046 | 0.000031 | 0.000041 | 0.003977 |
| 41 | 193 | 2959046 | 0.000033 | 0.000042 | 0.003977 |
| 41 | 194 | 2959046 | 0.000028 | 0.000041 | 0.003945 |
| 41 | 195 | 2959046 | 0.000026 | 0.000039 | 0.003977 |
| 41 | 196 | 2959046 | 0.000031 | 0.000040 | 0.003977 |
| 41 | 197 | 2959046 | 0.000030 | 0.000042 | 0.003977 |
| 41 | 198 | 2959046 | 0.000030 | 0.000039 | 0.003977 |
| 41 | 199 | 2959046 | 0.000029 | 0.000040 | 0.003977 |
| 41 | 200 | 2959046 | 0.000031 | 0.000040 | 0.003977 |
| 41 | 201 | 2959046 | 0.000032 | 0.000040 | 0.004008 |
| 41 | 202 | 2959046 | 0.000027 | 0.000040 | 0.003977 |
| 41 | 203 | 2959046 | 0.000026 | 0.000040 | 0.003977 |
| 41 | 204 | 2959046 | 0.000030 | 0.000040 | 0.003977 |
| 41 | 205 | 2959046 | 0.000032 | 0.000041 | 0.004008 |
| 41 | 206 | 2959046 | 0.000026 | 0.000039 | 0.003977 |
| 41 | 207 | 2959046 | 0.000031 | 0.000040 | 0.003977 |
| 41 | 208 | 2959046 | 0.000031 | 0.000040 | 0.003977 |
| 41 | 209 | 2959046 | 0.000027 | 0.000041 | 0.003977 |
| 41 | 210 | 2959046 | 0.000031 | 0.000041 | 0.003945 |
| 41 | 211 | 2959046 | 0.000032 | 0.000040 | 0.003914 |
| 41 | 212 | 2959046 | 0.000030 | 0.000042 | 0.003914 |
| 41 | 213 | 2959046 | 0.000028 | 0.000038 | 0.003977 |
| 41 | 214 | 2959046 | 0.000029 | 0.000043 | 0.003977 |
| 41 | 215 | 2959046 | 0.000030 | 0.000040 | 0.003977 |
| 41 | 216 | 2959046 | 0.000029 | 0.000040 | 0.003883 |
| 41 | 217 | 2959046 | 0.000027 | 0.000041 | 0.003977 |
| 41 | 218 | 2959046 | 0.000028 | 0.000040 | 0.003977 |
| 41 | 219 | 2959046 | 0.000030 | 0.000042 | 0.003977 |
| 41 | 220 | 2959046 | 0.000029 | 0.000042 | 0.003977 |
| 41 | 221 | 2959046 | 0.000028 | 0.000040 | 0.004008 |
| 41 | 222 | 2959046 | 0.000027 | 0.000043 | 0.003945 |
| 41 | 223 | 2959046 | 0.000029 | 0.000040 | 0.003977 |
| 41 | 224 | 2959046 | 0.000029 | 0.000041 | 0.003977 |
| 41 | 225 | 2959046 | 0.000028 | 0.000034 | 0.003977 |
| 41 | 226 | 2959046 | 0.000029 | 0.000041 | 0.003977 |
| 41 | 227 | 2959046 | 0.000030 | 0.000042 | 0.003977 |
| 41 | 228 | 2959046 | 0.000028 | 0.000043 | 0.003977 |
| 41 | 229 | 2959046 | 0.000028 | 0.000040 | 0.004039 |
| 41 | 230 | 2959046 | 0.000025 | 0.000043 | 0.004039 |
| 41 | 231 | 2959046 | 0.000026 | 0.000045 | 0.003977 |
| 41 | 232 | 2959046 | 0.000027 | 0.000040 | 0.003977 |
| 41 | 233 | 2959046 | 0.000028 | 0.000041 | 0.003945 |
| 41 | 234 | 2959046 | 0.000028 | 0.000039 | 0.003977 |
| 41 | 235 | 2959046 | 0.000028 | 0.000044 | 0.004039 |
| 41 | 236 | 2959046 | 0.000026 | 0.000043 | 0.003977 |
| 41 | 237 | 2959046 | 0.000027 | 0.000040 | 0.004008 |
| 41 | 238 | 2959046 | 0.000029 | 0.000038 | 0.003945 |
| 41 | 239 | 2959046 | 0.000033 | 0.000042 | 0.003977 |
| 41 | 240 | 2959046 | 0.000029 | 0.000040 | 0.003977 |
| 41 | 241 | 2959046 | 0.000029 | 0.000041 | 0.003977 |
| 41 | 242 | 2959046 | 0.000030 | 0.000040 | 0.003945 |
| 41 | 243 | 2959046 | 0.000026 | 0.000038 | 0.003945 |
| 41 | 244 | 2959046 | 0.000023 | 0.000042 | 0.003945 |
| 41 | 245 | 2959046 | 0.000028 | 0.000039 | 0.003977 |
| 41 | 246 | 2959046 | 0.000028 | 0.000039 | 0.003977 |
| 41 | 247 | 2959046 | 0.000025 | 0.000042 | 0.003977 |
| 41 | 248 | 2959046 | 0.000029 | 0.000041 | 0.003977 |
| 41 | 249 | 2959046 | 0.000027 | 0.000039 | 0.003945 |
| 41 | 250 | 2959046 | 0.000030 | 0.000040 | 0.003977 |
| 41 | 251 | 2959046 | 0.000027 | 0.000042 | 0.003977 |
| 41 | 252 | 2959046 | 0.000029 | 0.000043 | 0.003977 |
| 41 | 253 | 2959046 | 0.000031 | 0.000038 | 0.027105 |
| 41 | 254 | 2959046 | 0.000030 | 0.000039 | 0.027167 |
| 41 | 255 | 2959046 | 0.000031 | 0.000040 | 0.027229 |

Figure 2:
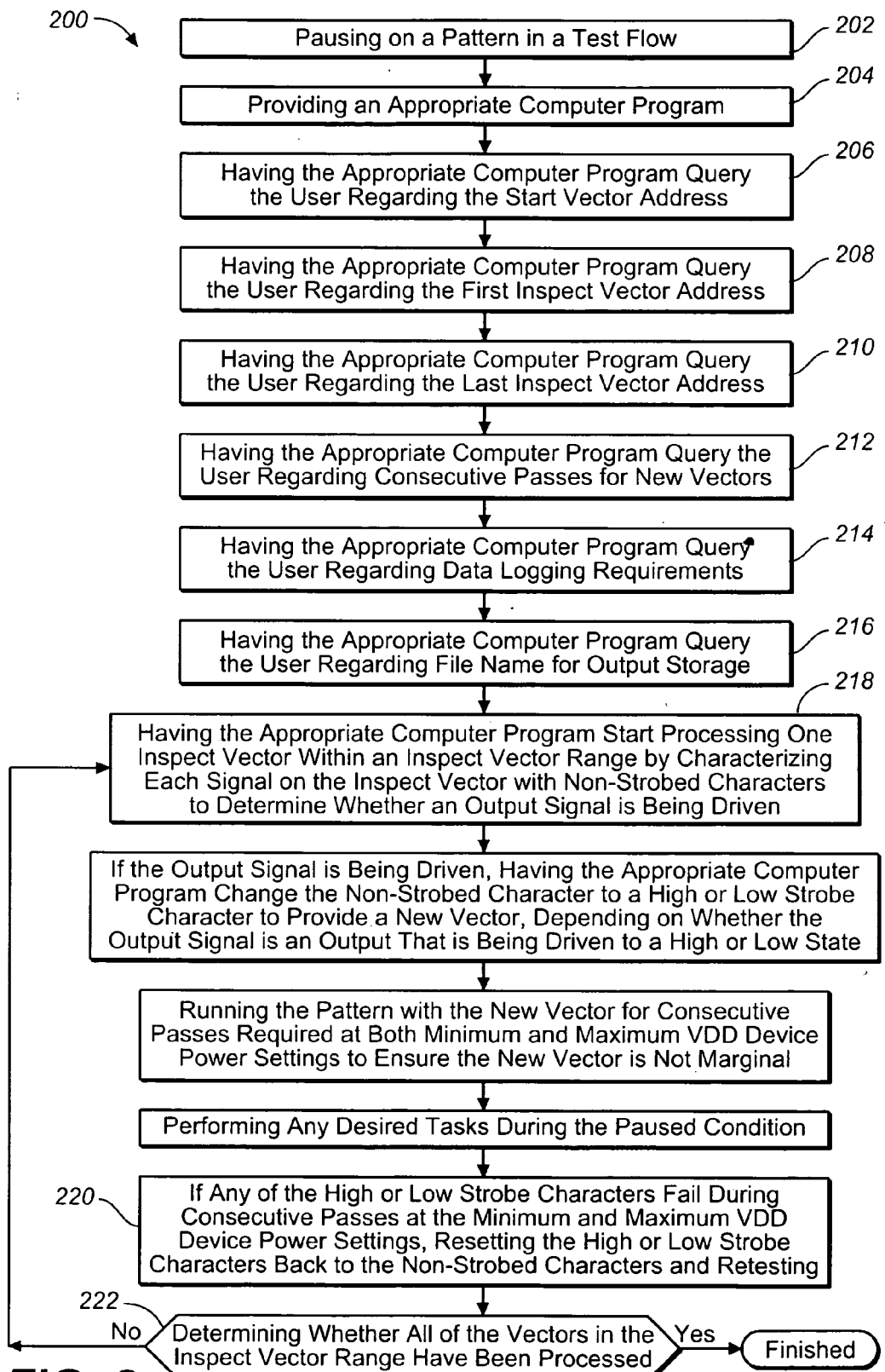
FIG. 2 illustrates a flow chart depicting a second method of the invention.

The invention provides a method 200 for using the stimulations and responses of a known good device to increase the fault coverage of the patterns in the test flow. The method 200 includes a number of individual steps, as illustrated in FIG. 2.

The method 200 preferably begins with step 202, which is to pause on the pattern of interest in the test program flow.

Step 204 of the method 200 is to provide an appropriate computer program.

Step 206 of the method 200 is to have the appropriate computer program query the user regarding the start vector address.

Step 208 of the method 200 is to have the appropriate computer program query the user regarding the first inspect vector address.

Step 210 of the method 200 is to have the appropriate computer program query the user regarding the last inspect vector address, thus defining an inspect vector range between the first and last inspect vector addresses.

Step 212 of the method 200 is to have the appropriate computer program query the user regarding consecutive passes for new vectors.

Step 214 of the method 200 is to have the appropriate computer program query the user regarding data logging requirements.

Step 216 of the method 200 is to have the appropriate computer program query the user regarding file name for output storage.

Step 218 of the method 200 is to have the appropriate computer program start processing the pattern vectors in the inspect vector range. The appropriate computer program characterizes each of the signals on the current inspect vector with "X" or "don't care" characters to determine whether an output signal is actually being driven. If the output signal is being driven, the appropriate computer program will change the "X" or "don't care" character to the appropriate high "H" or low "L" strobe character, depending on whether the signal is actually an output that is being driven to a high or low state. Once the appropriate computer program has completed changing an entire vector, it will run the pattern with the new vector for the consecutive passes required by the user. This will be done at both minimum and maximum normal operating voltage (VDD) device power settings to insure the new vector is not marginal. The "X" or "don't care" characters are typically signal output characters that are not strobed and, therefore, they do not add to the fault coverage of the test.

Step 220 of the method 200 is to reset the new "H" or "L" strobe characters back to their original "X" or "don't care" characters if any of the new "H" or "L" strobe characters fail during consecutive passes at the minimum and maximum VDD power settings and then retesting. Step 220 will continue until the new vector passes the required number of consecutive passes.

Step 222 of the method 200 is to process the next inspect vector by repeating steps 218 and 220 as necessary. The method 200 will continue until all of the vectors in the inspect vector range have been processed. The results will be saved to the file specified by the user and the pattern file containing the new vectors may be saved in the appropriate computer program for future use.

Thus, the method 200 uses the appropriate computer program to use the stimulations and responses of a know good device to increase the fault coverage of the patterns in the test flow. The appropriate computer program does this by changing the patterns to include additional strobes in the pattern vectors that could not be determined during simulations.

The method 200 has a number of advantages, including, the fact that it resides within the test program and can be invoked easily and that it can automatically characterize the outputs of a device to increase the fault coverage of the test program without the disadvantages of re-design and re-simulation.

Table 5 provides an example run of the appropriate computer program using the method 200.

TABLE 5

```
Enter   ^A <advance>   to start
        ^F <finish>    to stop
        ^P             to pause
begin> pause fct
begin> data fct
begin>
    STDF Version 4 has been enabled
STDF collection file '/home3/STDF/coll_UNSPECIFIED.std' is opened.
chmod: /home3/STDF/coll_UNSPECIFIED.std: Not owner
BLK_B1_FUNC_MIN                                         235520 to 315127 pass
break> faq <-----User is paused on the pattern of interest in invokes FAQuest
For options 1 and 2 you must already be paused on the
pattern of interest
For option 3 you must be paused on the functional
continuity test.
If you are not paused as required, choose option 4
to exit this menu to get to the required pause
location.
In addition, options 1 and 3 use a user defined pinlist
RMA that is initially set to ALLPIN. You can update
the RMA pinlist by using the interactive pinl command
prior to using options 1 and 3 of this routine.
Note: In many menus if you enter a -l it will return
you to the test program flow.
Enter a 1 for ATESignature scan analysis.
Enter a 2 for ATEPattern changing analysis.
Enter a 3 for ATECurve tracing analysis.
Enter a 4 to return to the program.
Enter your selection: 2 <----- User select the ATEPattern changing analysis option.
    Enter the pattern start address: 235520 <----- User input.
    You should make sure the first vector to inspect
    does not include the initialization vectors. An
    inspection of the pattern file will usually show
    where the initialization vectors end. However a
    safe assumption is to skip the first 100 vectors
    of information. If you get a functional burst
    fail after the change you likely need to skip
    additional vectors.
    Enter the first vector address to inspect:        235620 <----- User input.
    Enter the last vector address to inspect:  235640 <----- User input.
    Consequtive passes required for new vectors (default 1):  2 <----- User input.
Enter the number that corresponds to your data
logging requirements of the vector anaylsis.
Enter a 1 for no vector data logging analysis.
```

TABLE 5-continued

Enter a 2 for on screen data logging analysis.
Enter a 3 for open a file for data logging.
Enter a 4 for both.
Enter the data logging switch option:    4 <---- User input.
Do not make the file name the same as the program name.
Enter a file name: example_run.txt <---- User input.
The file example_run.txt has been opened.
Skip Processing of a Non-Inspect Vector 235520
Skip Processing of a Non-Inspect Vector 235521
Skip Processing of a Non-Inspect Vector 235522
Skip Processing of a Non-Inspect Vector 235523
Skip Processing of a Non-Inspect Vector 235524
Skip Processing of a Non-Inspect Vector 235525
Skip Processing of a Non-Inspect Vector 235526
Skip Processing of a Non-Inspect Vector 235527
Skip Processing of a Non-Inspect Vector 235528
Skip Processing of a Non-Inspect Vector 235529
Skip Processing of a Non-Inspect Vector 235530
Skip Processing of a Non-Inspect Vector 235531
Skip Processing of a Non-Inspect Vector 235532
Skip Processing of a Non-Inspect Vector 235533
Skip Processing of a Non-Inspect Vector 235534
Skip Processing of a Non-Inspect Vector 235535
Skip Processing of a Non-Inspect Vector 235536
Skip Processing of a Non-Inspect Vector 235537
Skip Processing of a Non-Inspect Vector 235538
Skip Processing of a Non-Inspect Vector 235539
Skip Processing of a Non-Inspect Vector 235540
Skip Processing of a Non-Inspect Vector 235541
Skip Processing of a Non-Inspect Vector 235542
Skip Processing of a Non-Inspect Vector 235543
Skip Processing of a Non-Inspect Vector 235544
Skip Processing of a Non-Inspect Vector 235545
Skip Processing of a Non-Inspect Vector 235546
Skip Processing of a Non-Inspect Vector 235547
Skip Processing of a Non-Inspect Vector 235548
Skip Processing of a Non-Inspect Vector 235549
Skip Processing of a Non-Inspect Vector 235550
Skip Processing of a Non-Inspect Vector 235551
Skip Processing of a Non-Inspect Vector 235552
Skip Processing of a Non-Inspect Vector 235553
Skip Processing of a Non-Inspect Vector 235554
Skip Processing of a Non-Inspect Vector 235555
Skip Processing of a Non-Inspect Vector 235556
Skip Processing of a Non-Inspect Vector 235557
Skip Processing of a Non-Inspect Vector 235558
Skip Processing of a Non-Inspect Vector 235559
Skip Processing of a Non-Inspect Vector 235560
Skip Processing of a Non-Inspect Vector 235561
Skip Processing of a Non-Inspect Vector 235562
Skip Processing of a Non-Inspect Vector 235563
Skip Processing of a Non-Inspect Vector 235564
Skip Processing of a Non-Inspect Vector 235565
Skip Processing of a Non-Inspect Vector 235566
Skip Processing of a Non-Inspect Vector 235567
Skip Processing of a Non-Inspect Vector 235568
Skip Processing of a Non-Inspect Vector 235569
Skip Processing of a Non-Inspect Vector 235570
Skip Processing of a Non-Inspect Vector 235571
Skip Processing of a Non-Inspect Vector 235572
Skip Processing of a Non-Inspect Vector 235573
Skip Processing of a Non-Inspect Vector 235574
Skip Processing of a Non-Inspect Vector 235575
Skip Processing of a Non-Inspect Vector 235576
Skip Processing of a Non-Inspect Vector 235577
Skip Processing of a Non-Inspect Vector 235578
Skip Processing of a Non-Inspect Vector 235579
Skip Processing of a Non-Inspect Vector 235580
Skip Processing of a Non-Inspect Vector 235581
Skip Processing of a Non-Inspect Vector 235582
Skip Processing of a Non-Inspect Vector 235583
Skip Processing of a Non-Inspect Vector 235584
Skip Processing of a Non-Inspect Vector 235585
Skip Processing of a Non-Inspect Vector 235586
Skip Processing of a Non-Inspect Vector 235587
Skip Processing of a Non-Inspect Vector 235588
Skip Processing of a Non-Inspect Vector 235589
Skip Processing of a Non-Inspect Vector 235590
Skip Processing of a Non-Inspect Vector 235591

TABLE 5-continued

```
Skip Processing of a Non-Inspect Vector 235592
Skip Processing of a Non-Inspect Vector 235593
Skip Processing of a Non-Inspect Vector 235594
Skip Processing of a Non-Inspect Vector 235595
Skip Processing of a Non-Inspect Vector 235596
Skip Processing of a Non-Inspect Vector 235597
Skip Processing of a Non-Inspect Vector 235598
Skip Processing of a Non-Inspect Vector 235599
Skip Processing of a Non-Inspect Vector 235600
Skip Processing of a Non-Inspect Vector 235601
Skip Processing of a Non-Inspect Vector 235602
Skip Processing of a Non-Inspect Vector 235603
Skip Processing of a Non-Inspect Vector 235604
Skip Processing of a Non-Inspect Vector 235605
Skip Processing of a Non-Inspect Vector 235606
Skip Processing of a Non-Inspect Vector 235607
Skip Processing of a Non-Inspect Vector 235608
Skip Processing of a Non-Inspect Vector 235609
Skip Processing of a Non-Inspect Vector 235610
Skip Processing of a Non-Inspect Vector 235611
Skip Processing of a Non-Inspect Vector 235612
Skip Processing of a Non-Inspect Vector 235613
Skip Processing of a Non-Inspect Vector 235614
Skip Processing of a Non-Inspect Vector 235615
Skip Processing of a Non-Inspect Vector 235616
Skip Processing of a Non-Inspect Vector 235617
Skip Processing of a Non-Inspect Vector 235618
Skip Processing of a Non-Inspect Vector 235619
Processing Inspect Vector 235620 of 235640
BLK_B1_FUNC_MIN                              235520 to 235640 pass
First status ficm read = 0
First status ficm read = 0
Changed an X to an H.
First status ficm write = 0
Xs changed to Ls = 0
Xs changed to Hs = 1
Power supplies set to minimum.
Consequtive get_data_log result, the Ls and Hs have been written
Result (Fail[70], Pass[80]) = 80, Vector = -1, Valid = 0
Consequtive get data_log result, the Ls and Hs have been written
Result (Fail[70], Pass[80]) = 80, Vector = -1, Valid = 0
Power supplies set to maximum
Consequtive get data log result, the Ls and Hs have been written
Result (Fail[70], Pass[80]) = 80, Vector = -1, Valid = 0
Consequtive get data_log result, the Ls and Hs have been written
Result (Fail[70], Pass[80]) = 80, Vector = -1, Valid = 0
These counts only relate to the pins included in your pinlist.
Beginning Vector X Count = 75
Vector Xs changed to Ls = 0
Vector Xs changed to Hs = 1
Vector Xs unchanged = 74
Processing Inspect Vector 235621 of 235640
BLK_B1_FUNC_MIN                              235520 to 235640 pass
First status ficm read = 0
First status ficm read = 0
Changed an X to an H.
First status ficm write = 0
Xs changed to Ls = 0
Xs changed to Hs = 1
Power supplies set to minimum.
Consequtive get data_log result, the Ls and Hs have been written
Result (Fail[70], Pass[80]) = 80, Vector = -1, Valid = 0
Consequtive get_data_log result, the Ls and Hs have been written
Result (Fail[70], Pass[80]) = 80, Vector = -1, Valid = 0
Power supplies set to maximum
Consequtive get data_log result, the Ls and Hs have been written
Result (Fail[70], Pass[80]) = 80, Vector = -1, Valid = 0
Consequtive get_data log result, the Ls and Hs have been written
Result (Fail[70], Pass[80]) = 80, Vector = -1, Valid = 0
These counts only relate to the pins included in your pinlist.
Beginning Vector X Count = 75
Vector Xs changed to Ls = 0
Vector Xs changed to Hs = 1
Vector Xs unchanged = 74
Processing Inspect Vector 235622 of 235640
BLK_B1_FUNC_MIN                              235520 to 235640 pass
First status ficm read = 0
First status ficm read = 0
Changed an X to an H.
```

TABLE 5-continued

First status ficm write = 0
Xs changed to Ls = 0
Xs changed to Hs = 1
Power supplies set to minimum.
Consequtive get data_log result, the Ls and Hs have been written
Result (Fail[70], Pass[80]) = 80, Vector = −1, Valid = 0
Consequtive get data_log result, the Ls and Hs have been written
Result (Fail[70], Pass[80]) = 80, Vector = −1, Valid = 0
Power supplies set to maximum
Consequtive get data log result, the Ls and Hs have been written
Result (Fail[70], Pass[80]) = 80, Vector = −1, Valid = 0
Consequtive get data_log result, the Ls and Hs have been written
Result (Fail[70], Pass[80]) = 80, Vector = −1, Valid = 0
These counts only relate to the pins included in your pinlist.
Beginning Vector X Count = 75
Vector Xs changed to Ls = 0
Vector Xs changed to Hs = 1
Vector Xs unchanged = 74
Processing Inspect Vector 235623 of 235640
BLK_B1_FUNC_MIN                                    235520 to 235640 pass
First status ficm read = 0
First status ficm read = 0
Changed an X to an H.
First status ficm write = 0
Xs changed to Ls = 0
Xs changed to Hs = 1
Power supplies set to minimum.
Consequtive get_data_log result, the Ls and Hs have been written
Result (Fail[70], Pass[80]) 80, Vector = −1, Valid = 0
Consequtive get_data_log result, the Ls and Hs have been written
Result (Fail[70], Pass[80]) = 80, Vector = −1, Valid = 0
Power supplies set to maximum
Consequtive get_data_log result, the Ls and Hs have been written
Result (Fail[70], Pass[80]) = 80, Vector = −1, Valid = 0
Consequtive get data_log result, the Ls and Hs have been written
Result (Fail[70], Pass[80]) = 80, Vector = −1, Valid = 0
These counts only relate to the pins included in your pinlist.
Beginning Vector X Count = 75
Vector Xs changed to Ls = 0
Vector Xs changed to Hs = 1
Vector Xs unchanged = 74
Processing Inspect Vector 235624 of 235640
BLK_B1_FUNC_MIN                                    235520 to 235640 pass
First status ficm read = 0
First status ficm read = 0
Changed an X to an H.
First status ficm write = 0
Xs changed to Ls = 0
Xs changed to Hs = 1
Power supplies set to minimum.
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
Power supplies set to maximum
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
These counts only relate to the pins included in your pinlist.
Beginning Vector X Count = 75
Vector Xs changed to Ls = 0
Vector Xs changed to Hs = 1
Vector Xs unchanged = 74
Processing Inspect Vector 235625 of 235640
BLK_B1_FUNC_MIN                                    235520 to 235640 pass
First status ficm read = 0
First status ficm read = 0
Changed an X to an H.
First status ficm write = 0
Xs changed to Ls = 0
Xs changed to Hs = 1
Power supplies set to minimum.
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
Power supplies set to maximum
Consequtive get_data_log result, the Ls and Hs have been written TABLE 5-continued Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
These counts only relate to the pins included in your pinlist.
Beginning Vector X Count = 75
Vector Xs changed to Ls = 0
Vector Xs changed to Hs = 1
Vector Xs unchanged = 74
Processing Inspect Vector 235626 of 235640
BLK_B1_FUNC_MIN                                         235520 to 235640 pass
First status ficm read = 0
First status ficm read = 0
Changed an X to an H.
First status ficm write = 0
Xs changed to Ls = 0
Xs changed to Hs = 1
Power supplies set to minimum.
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
Power supplies set to maximum
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
These counts only relate to the pins included in your pinlist.
Beginning Vector X Count = 75
Vector Xs changed to Ls = 0
Vector Xs changed to Hs = 1
Vector Xs unchanged = 74
Processing Inspect Vector 235627 of 235640
BLK_B1_FUNC_MIN                                         235520 to 235640 pass
First status ficm read = 0
First status ficm read = 0
Changed an X to an H.
First status ficm write = 0
Xs changed to Ls = 0
Xs changed to Hs = 1
Power supplies set to minimum.
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
Power supplies set to maximum
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
These counts only relate to the pins included in your pinlist.
Beginning Vector X Count = 75
Vector Xs changed to Ls = 0
Vector Xs changed to Hs = 1
Vector Xs unchanged = 74
Processing Inspect Vector 235628 of 235640
BLK_B1_FUNC_MIN                                         235520 to 235640 pass
First status ficm read = 0
First status ficm read = 0
Changed an X to an H.
First status ficm write = 0
Xs changed to Ls = 0
Xs changed to Hs = 1
Power supplies set to minimum.
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
Power supplies set to maximum
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
These counts only relate to the pins included in your pinlist.
Beginning Vector X Count = 75
Vector Xs changed to Ls = 0
Vector Xs changed to Hs = 1
Vector Xs unchanged = 74
Processing Inspect Vector 235629 of 235640
BLK_B1_FUNC_MIN                                         235520 to 235640 pass TABLE 5-continued

```
First status ficm read = 0
First status ficm read = 0
Changed an X to an H.
First status ficm write = 0
Xs changed to Ls = 0
Xs changed to Hs = 1
Power supplies set to minimum.
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
Power supplies set to maximum
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
These counts only relate to the pins included in your pinlist.
Beginning Vector X Count = 75
Vector Xs changed to Ls = 0
Vector Xs changed to Hs = 1
Vector Xs unchanged = 74
Processing Inspect Vector 235630 of 235640
BLK_B1_FUNC_MIN                          235520 to 235640 pass
First status ficm read = 0
First status ficm read = 0
Changed an X to an H.
First status ficm write = 0
Xs changed to Ls = 0
Xs changed to Hs = 1
Power supplies set to minimum.
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
Power supplies set to maximum
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
These counts only relate to the pins included in your pinlist.
Beginning Vector X Count = 75
Vector Xs changed to Ls = 0
Vector Xs changed to Hs = 1
Vector Xs unchanged = 74
Processing Inspect Vector 235631 of 235640
BLK_B1_FUNC_MIN                          235520 to 235640 pass
First status ficm read = 0
First status ficm read = 0
Changed an X to an H.
First status ficm write = 0
Xs changed to Ls = 0
Xs changed to Hs = 1
Power supplies set to minimum.
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
Power supplies set to maximum
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
These counts only relate to the pins included in your pinlist.
Beginning Vector X Count = 75
Vector Xs changed to Ls = 0
Vector Xs changed to Hs = 1
Vector Xs unchanged = 74
Processing Inspect Vector 235632 of 235640
BLK_B1_FUNC_MIN                          235520 to 235640 pass
First status ficm read = 0
First status ficm read = 0
Changed an X to an H.
First status ficm write = 0
Xs changed to Ls = 0
Xs changed to Hs = 1
Power supplies set to minimum.
Consequtive get_data_log result, the Ls and Hs have been written
Result (Fail[70], Pass[80]) = 80, Vector = −1, Valid = 0
Consequtive get_data_log result, the Ls and Hs have been written
```

TABLE 5-continued

Result (Fail[70], Pass[80]) = 80, Vector = −1, Valid = 0
Power supplies set to maximum
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
These counts only relate to the pins included in your pinlist.
Beginning Vector X Count = 75
Vector Xs changed to Ls = 0
Vector Xs changed to Hs = 1
Vector Xs unchanged = 74
Processing Inspect Vector 235633 of 235640
BLK_B1_FUNC_MIN                                235520 to 235640 pass
First status ficm read = 0
First status ficm read = 0
Changed an X to an H.
First status ficm write = 0
Xs changed to Ls = 0
Xs changed to Hs = 1
Power supplies set to minimum.
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
Power supplies set to maximum
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
These counts only relate to the pins included in your pinlist.
Beginning Vector X Count = 75
Vector Xs changed to Ls = 0
Vector Xs changed to Hs = 1
Vector Xs unchanged = 74
Processing Inspect Vector 235634 of 235640
BLK_B1_FUNC_MIN                                235520 to 235640 pass
First status ficm read = 0
First status ficm read = 0
Changed an X to an H.
First status ficm write = 0
Xs changed to Ls = 0
Xs changed to Hs = 1
Power supplies set to minimum.
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
Power supplies set to maximum
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
These counts only relate to the pins included in your pinlist.
Beginning Vector X Count = 75
Vector Xs changed to Ls = 0
Vector Xs changed to Hs = 1
Vector Xs unchanged = 74
Processing Inspect Vector 235635 of 235640
BLK_B1_FUNC_MIN                                235520 to 235640 pass
First status ficm read = 0
First status ficm read = 0
Changed an X to an H.
First status ficm write = 0
Xs changed to Ls = 0
Xs changed to Hs = 1
Power supplies set to minimum.
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
Power supplies set to maximum
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
These counts only relate to the pins included in your pinlist.
Beginning Vector X Count = 75
Vector Xs changed to Ls = 0
Vector Xs changed to Hs = 1

TABLE 5-continued

```
Vector Xs unchanged = 74
Processing Inspect Vector 235636 of 235640
BLK_B1_FUNC_MIN                             235520 to 235640 pass
First status ficm read = 0
First status ficm read = 0
Changed an X to an H.
First status ficm write = 0
Xs changed to Ls = 0
Xs changed to Hs = 1
Power supplies set to minimum.
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
Power supplies set to maximum
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
These counts only relate to the pins included in your pinlist.
Beginning Vector X Count = 75
Vector Xs changed to Ls = 0
Vector Xs changed to Hs = 1
Vector Xs unchanged = 74
Processing Inspect Vector 235637 of 235640
BLK_B1_FUNC_MIN                             235520 to 235640 pass
First status ficm read = 0
First status ficm read = 0
Changed an X to an H.
First status ficm write = 0
Xs changed to Ls = 0
Xs changed to Hs = 1
Power supplies set to minimum.
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
Power supplies set to maximum
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
These counts only relate to the pins included in your pinlist.
Beginning Vector X Count = 75
Vector Xs changed to Ls = 0
Vector Xs changed to Hs = 1
Vector Xs unchanged = 74
Processing Inspect Vector 235638 of 235640
BLK_B1_FUNC_MIN                             235520 to 235640 pass
First status ficm read = 0
First status ficm read = 0
Changed an X to an H.
First status ficm write = 0
Xs changed to Ls = 0
Xs changed to Hs = 1
Power supplies set to minimum.
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
Power supplies set to maximum
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
These counts only relate to the pins included in your pinlist.
Beginning Vector X Count = 75
Vector Xs changed to Ls = 0
Vector Xs changed to Hs = 1
Vector Xs unchanged = 74
Processing Inspect Vector 235639 of 235640
BLK_B1_FUNC_MIN                             235520 to 235640 pass
First status ficm read = 0
First status ficm read = 0
Changed an X to an H.
First status ficm write = 0
Xs changed to Ls = 0
Xs changed to Hs = 1
Power supplies set to minimum.
```

TABLE 5-continued

```
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
Power supplies set to maximum
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
These counts only relate to the pins included in your pinlist.
Beginning Vector X Count = 75
Vector Xs changed to Ls = 0
Vector Xs changed to Hs = 1
Vector Xs unchanged = 74
Processing Inspect Vector 235640 of 235640
BLK_B1_FUNC_MIN                              235520 to 235640 pass
First status ficm read = 0
First status ficm read = 0
Changed an X to an H.
First status ficm write = 0
Xs changed to Ls = 0
Xs changed to Hs = 1
Power supplies set to minimum.
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
Power supplies set to maximum
Consequtive get_data_log result, the Ls and Hs have been written
Result (Fail[70], Pass[80]) = 80, Vector = −1, Valid = 0
Consequtive get_data_log result, the Ls and Hs have been written
Result (Fail[70], Pass[80]) = 80, Vector = −1, Valid = 0
These counts only relate to the pins included in your pinlist.
Beginning Vector X Count = 75
Vector Xs changed to Ls = 0
Vector Xs changed to Hs = 1
Vector Xs unchanged = 74
Pattern Summary
Total Pattern Xs Considered =          1575
Total Pattern Xs Remaining =           1554
Total Xs changed to Ls =                  0
Total Xs changed to Hs =                 21
Total Xs changed =                       21     This summary shows that the pattern
break>                                          fault coverage has been increased by
                                                changing the "X" or "don't care"
                                                strobe to output "H" strobes.
```

Figure 3:
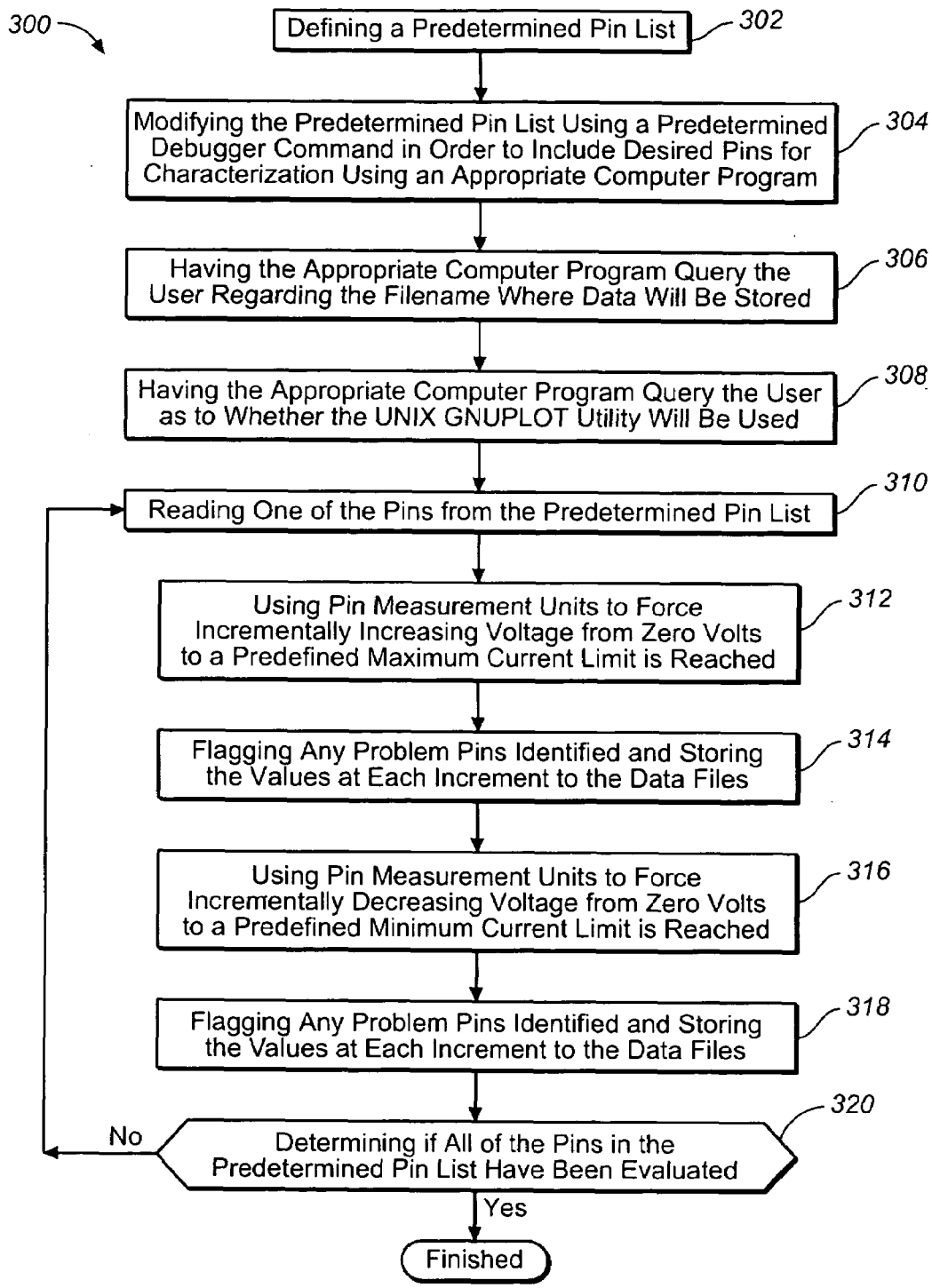
FIG. 3 illustrates a flow chart depicting a third method of the invention.

The invention further provides a method 300 to curve trace device buffers on an ATE. The method 300 includes a number of individual steps, as illustrated in FIG. 3.

The method 300 begins with step 302, which is to define a predetermined pin list. The predetermined pin list is set to include all of the pins used during the pattern loads.

Step 304 of the method 300 is to modify the predetermined pin list using a predetermined debugger command in order to include desired pins for characterization using an appropriate computer program.

Step 306 of the method 300 is to have the appropriate computer program query the user regarding the filename where data will be stored.

Step 308 of the method 300 is to have the appropriate computer program query the user as to whether the UNIX GNUPLOT utility will be used.

Step 310 of the method 300 is to read one of the pins from the predetermined pin list.

Step 312 of the method 300 is to use pin measurement units to force incrementally increasing voltage from zero (0) volts to a predefined maximum current limit is reached, for example, to a maximum of one (1) volt or until −100 μA of current limit is reached.

Step 314 of the method 300 is to flag any problem pins identified in step 312 and to store the values at each increment to the data files.

Step 316 of the method 300 is to use pin measurement units to force incrementally decreasing voltage from zero (0) volts to a predefined minimum current limit is reached, for example, to a minimum of negative one (−1) volt or until +100 μA of current limit is reached.

Step 318 of the method 300 is to flag any problem pins identified in step 316 and to store the values at each increment to the data files.

Step 320 of the method 300 is to determine if all of the pins in the predetermined pin list have been evaluated. If all of the pins in the predetermined pin list have been evaluated, the method 300 is finished. If, however, all of the pins in the predetermined pin list have not been evaluated, then the method 300 continues by returning to step 310 of the method 300 and then executing steps 310, 312, 314, 316, 318, 320 as appropriate.

It should be noted that all test limits and increments are programmable.

The data can be stored in three different files, the names of which are specified by the user, except where noted. The first file contains the pin name(s) and their associated data, such as voltage and current. The first file is stored in a space separated text format readable by offline analysis software, such as MathCAD or Microsoft EXCEL. The second file contains the individual pin data that are used by the standard UNIX 2D graphing utility "gnuplot". These files are automatically named with the pin name for the data it contains. The third file is a standard command file that the UNIX gnuplot utility can read to display the 2D graphs automatically.

Thus, the method 300 provides the user with the availability to curve trace device buffers on an ATE. The method 300 has the advantage of providing buffer curve tracing and characterizing during an ATE test session. The method 300 also has the advantage of not requiring the user to need to utilize offline curve tracing equipment. The method 300 further has the advantage of allowing the user the ability to view digitized data and abnormalities not detected with go-no-go tests.

The method 300 could alternatively be used to collect data used in the analysis of package development and the analysis of new fabrication technologies.

Step 312 of method 100 could alternatively use pin measurement units to force or sink incremental currents and measure voltage to characterize the device pins.

Tables 6–9 provide examples from using the method 300. Table 6 provides an example run of the appropriate computer program using the method 300. Table 7 provides an example of the files created by the method 300. Table 8 provides plot examples using the UNIX "gnuplot" utility and Microsoft EXCEL. Table 9 provides an example of the ability of the appropriate computer program to identify problems missed by a typical production test program.

TABLE 6

The following information was extracted from and actual test section and shows how ATECurve is executed.
begin> pause fct
begin>
STDF Version 4 has been enabled
STDF collection file '/home3/STDF/coll_UNSPECIFIED.std' is opened.
chmod: /home3/STDF/coll_UNSPECIFIED.std: Not owner
Pause in "BLK_OS_FUN_CON" due to functional fail
func_test(func_pins = ALLPIN, start_vec = 8 , stop_vec = 290)
This section of the test flow shows that the RMA pin list is initially set to all pins used on the device.
break> pinl rma
RMA    :  D279_SCSIR(1), D269_SCSII(2), D278_SCSIM(3), D266_SCSID(4),
          D270_SCSII(5), D276_SCSIS(6), D273_SCSIC(7), D275_SCSIS(8),
          D277_SCSIM(10), D288_SCSIA(11), D274_SCSIC(12), D280_SCSIR(13),
          D286_SCSIB(14), D285_SCSIB(16), D295_SCSID(17), D282_SCSIA(18),
          D296_SCSID(19), D281_SCSIA(20), D294_SCSID(21), D287_SCSIA(23),
          D291_SCSIP(24), D299_SCSID(25), D292_SCSIP(26), D300_SCSID(27),
          D293_SCSID(28), D301_SCSID(29), D297_SCSID(31), D298_SCSID(32),
          D308_SCSID(33), D302_SCSID(34), D307_SCSID(35), D303_SCSID(36),
          D309_SCSIP(37), D305_SCSID(38), D306_SCSID(39), D304_SCSID(40),
          D316_SCSID(41), D312_SCSID(42), D313_SCSID(43), D314_SCSID(44),
          D322_SCANM(45), D310_SCSIP(46), D319_TM(47), D311_SCSID(48),
          D317_SCSID(51), D326_PIPES(52), D328_TRACE(53), D315_SCSID(54),
          D325_PIPES(55), D323_TN(56), D001_TRACE(63), D076_TMSIC(65),
          D063_SCSIP(66), D073_IDDTN(67), D064_SCSIP(68), D067_SCSID(69),
          D062_SCSID(70), D066_SCSID(71), D065_SCSID(72), D142_PCIAD(89),
          D133_NPCIT(90), D145_PCIAD(91), D125_PCIAD(92), D136_NPCIP(93),
          D144_PCIAD(94), D140_PCIAD(95), D137_NPCIS(96), D216_GPIO_(97),
          D166_GPIO_(98), D226_NFLAS(99), D165_GPIO_(100), D214_GPIO_(102),
          D225_NFLAS(103), D215_GPIO_(104), D240_MAD_0(105),
          D234_MAD_5(106), D244_MAD_9(107), D230_NRAMW(108),
          D228_NRAMO(110), D237_MAD_3(112), D074_CLKMO(121),
          D068_SCSID(122), D070_SCSID(123), D069_SCSID(124),
          D072_SCSID(125), D075_TCKIC(126), D071_SCSID(127),
          D080_RTCKI(128), D155_PCIAD(129), D158_NPCIA(131),
          D139_NPCIC(132), D148_PCIAD(133), D152_PCIAD(134),
          D141_PCIAD(135), D138_PCIPA(136), D154_PCIAD(137),
          D147_PCIAD(138), D150_PCIAD(139), D146_PCIAD(140),
          D149_NPCIC(141), D153_PCIAD(143), D157_PCIAD(144),
          D175_NPCIC(145), D151_PCIAD(146), D156_PCIAD(148),
          D159_NPCIR(151), D178_PCIAD(153), D161_PCICL(154),
          D173_NPCIC(158), D179_PCIAD(159), D183_PCIAD(161),
          D167_CLKMO(162), D182_PCIAD(163), D172_NPCIC(164),
          D174_NPCIC(165), D176_PCIPA(166), D180_PCIAD(168),
          D190_PCIAD(169), D177_PCIAD(170), D186_PCIAD(171),
          D181_PCIAD(172), D187_PCIAD(173), D184_PCIAD(175),
          D191_PCIAD(176), D204_PCIAD(177), D185_PCIAD(178),
          D196_PCIAD(179), D192_PCIAD(180), D195_PCIAD(181),
          D189_PCIAD(182), D194_PCIAD(183), D193_PCIAD(184),
          D203_PCIAD(185), D198_PCIAD(186), D202_PCIAD(187),
          D201_PCIAD(188), D200_PCIAD(189), D197_PCIAD(190),
          D199_PCIAD(191), D205_PCIAD(192), D209_PCIAD(194),
          D208_PCIAD(196), D211_SPARE(198), D206_PCIAD(199),
          D212_SCANE(200), D207_PCIAD(202), D219_LED1(203),
          D222_GPIO_(205), D218_GPIO_(207), D221_SERIA(210),
          D223_GPIO_(213), D224_LED0(214), D220_SERIA(215),

TABLE 6-continued

```
            D229_NFLAS(220), D238_MAD_2(229), D232_MAD_7(231),
            D260_DIFFS(233), D255_NRAMA(235), D242_LEDHB(236),
            D251_MPAR_(237), D245_MAD_1(238), D248_MAD_1(239),
            D252_MPAR_(240), D263_SCSID(241), D257_SPARE(242),
            D256_NRAMC(243), D261_SCSID(244), D249_MAD_1(245),
            D262_SCSID(246), D254_NRAMA(247), D271_SCSIR(249),
            D265_SCSID(250), D272_SCSIR(251), D253_MCLK(252),
            D268_SCSID(253), D264_SCSID(255), D267_SCSID(256),
            D005_TRACE(257), D002_TRACE(259), D327_PIPES(260),
            D006_TRACE(261), D318_SCSID(262), D004_TRACE(263),
            D324_TRACE(264), D003_TRACE(265), D008_TRACE(267),
            D014_DIFFS(268), D012_SCSIC(269), D016_SCSID(271),
            D015_SCSID(272), D017_SCSID(274), D019_SCSID(275),
            D018_SCSID(276), D021_SCSID(277), D022_SCSID(279),
            D007_TRACE(280), D024_SCSII(281), D026_SCSIR(282),
            D027_SCSIC(283), D025_SCSIR(284), D028_SCSIC(285),
            D020_SCSID(286), D029_SCSIS(287), D023_SCSII(288),
            D036_SCSIA(289), D031_SCSIM(290), D041_SCSIA(291),
            D032_SCSIM(292), D033_SCSIR(293), D030_SCSIS(294),
            D034_SCSIR(295), D035_SCSIA(296), D045_SCSIP(297),
            D046_SCSIP(299), D038_SCSIB(300), D047_SCSID(301),
            D037_SCSIB(302), D040_SCSIA(304), D050_SCSID(305),
            D053_SCSID(307), D051_SCSID(308), D052_SCSID(309),
            D048_SCSID(310), D049_SCSID(312), D059_SCSID(313),
            D054_SCSID(314), D060_SCSID(315), D057_SCSID(316),
            D061_SCSID(317), D055_SCSID(318), D058_SCSID(319),
            D056_SCSID(320), D083_NDISS(321), D078_TDOIC(322),
            D079_TRSTI(323), D084_TESTH(324), D093_TDI(325), D077_TDIIC(326),
            D090_TCK(329), D091_TMS(330), D085_TESTA(331), D096_PVT1(333),
            D088_NTEST(335), D086_M66EN(336), D099_NINTA(337), D094_TDO(338),
            D101_NALTI(341), D100_NINTB(343), D106_NPCIG(346),
            D103_NPCIR(347), D109_PCIAD(348), D108_PCIAD(349),
            D102_NALTI(350), D119_PCIAD(353), D107_NPCIR(354),
            D116_PCIAD(355), D111_PCIAD(356), D122_PCIAD(357),
            D112_PCIAD(358), D114_PCIAD(359), D113_PCIAD(360),
            D129_PCIAD(361), D115_PCIAD(362), D130_NPCIC(363),
            D121_PCIAD(365), D117_NPCIC(366), D120_PCIAD(367),
            D118_PCIID(368), D134_NPCID(369), D135_NPCIS(371),
            D126_PCIAD(372), D132_NPCII(373), D131_NPCIF(374),
            D128_PCIAD(376), D243_MAD_8(377), D239_MAD_1(378),
            D246_MAD_1(379), D235_MAD_4(380), D250_MAD_1(381),
            D233_MAD_6(382), D247_MAD_1(383), D241_NRAMW(384)
```

Here the user sets the RMA pin list to the pins of interest.
break> pinl rma = 191,246,337
pinlist RMA is being superseded
This section shows how the user invokes the FAQuest software using a three character
short cut. Some simple instructions are displayed through out the run and the user
provides the appropriate selections or inputs for the device under test.
break> faq ←--------- User invokes FAQuest
For options 1 and 2 you must already be paused on the
pattern of interest
For option 3 you must be paused on the functional
continuity test.
If you are not paused as required, choose option 4
to exit this menu to get to the required pause
location.
In addition, options 1 and 3 use a user defined pinlist
RMA that is initially set to ALLPIN. You can update
the RMA pinlist by using the interactive pinl command
prior to using options 1 and 3 of this routine.
Note: In many menus if you enter a −1 it will return
you to the test program flow.
Enter a 1 for ATESignature scan analysis.
Enter a 2 for ATEPattern changing analysis.
Enter a 3 for ATECurve tracing analysis.
Enter a 4 to return to the program.
Enter your selection: 3 ←--------- User selects the ATECurve option.
The curve trace data will be saved to a file in
both row and column format for data manuipulation
and/or use in spreadsheet software.
Do not make the file name the same as the program name.
Enter a file name where your data will be stored:attachment2.txt ←--------
                User inputs filename where data will be stored.
Remember you can update the RMA pinlist interactively
on the tester by using the pinl command. This is
a very easy process and can be used as many times
as you want in between executions of this utility.
You can also use the gnuplot utility on the tester
to plot the curve traces during your test session.

TABLE 6-continued

This utility will save a file for each pin in the
format that gnuplot requires; in addition it will
create a file called "ct" for easy pasting
of the plot command to the gnu_plot utility.
Will you use the gnuplot utility? [0=no, 1=yes]: 1 ⟵---------- User option.
The file attachment2.txt has been opened.
The 3 pins that were selected are processed, and the information has been save to the
appropriate files. The files are included in Attachment 3 and the plots are included in
Attachment 4.
Pin 1  of 3  being processed: pin =    D199_PCIAD(P191)
Pin 2  of 3  being processed: pin =    D262_SCSID(P246)
Pin 3  of 3  being processed: pin =    D099_NINTA(P337)
break>

TABLE 7

This is an example of one of the UNIX "gnuplot" utility pin (buffer) data files
created by the ATECurve program.
Voltage D099_NINTA(P337)
```
-0.510   -0.000125
-0.500   -0.000097
-0.490   -0.000072
-0.480   -0.000053
-0.470   -0.000038
-0.460   -0.000028
-0.450   -0.000020
-0.440   -0.000014
-0.430   -0.000010
-0.420   -0.000007
-0.410   -0.000005
-0.400   -0.000004
-0.390   -0.000003
-0.380   -0.000002
-0.370   -0.000001
-0.360   -0.000001
-0.350   -0.000001
-0.340   -0.000000
-0.330   -0.000000
-0.320   -0.000000
-0.310   -0.000000
-0.300   -0.000000
-0.290   -0.000000
-0.280   -0.000000
-0.270   -0.000000
-0.260   -0.000000
-0.250   -0.000000
-0.240   -0.000000
-0.230   -0.000000
-0.220   -0.000000
-0.210   -0.000000
-0.200   -0.000000
-0.190   -0.000000
-0.180   -0.000000
-0.170   -0.000000
-0.160   -0.000000
-0.150   -0.000000
-0.140   -0.000000
-0.130   -0.000000
-0.120   -0.000000
-0.110   -0.000000
-0.100   -0.000000
-0.090   -0.000000
-0.080   -0.000000
-0.070   -0.000000
-0.060   -0.000000
-0.050   -0.000000
-0.040   +0.000000
-0.030   -0.000000
-0.020   +0.000000
-0.010   -0.000000
 0.000   +0.000000
 0.010   +0.000000
 0.020   +0.000000
 0.030   +0.000000
 0.040   +0.000000
 0.050   +0.000000
```

TABLE 7-continued

| | |
|---|---|
| 0.060 | +0.000000 |
| 0.070 | +0.000000 |
| 0.080 | +0.000000 |
| 0.090 | +0.000000 |
| 0.100 | +0.000000 |
| 0.110 | +0.000000 |
| 0.120 | +0.000000 |
| 0.130 | +0.000000 |
| 0.140 | +0.000000 |
| 0.150 | +0.000000 |
| 0.160 | +0.000000 |
| 0.170 | +0.000000 |
| 0.180 | +0.000000 |
| 0.190 | +0.000000 |
| 0.200 | +0.000000 |
| 0.210 | +0.000000 |
| 0.220 | +0.000000 |
| 0.230 | +0.000000 |
| 0.240 | +0.000000 |
| 0.250 | +0.000000 |
| 0.260 | +0.000000 |
| 0.270 | +0.000000 |
| 0.280 | +0.000000 |
| 0.290 | +0.000000 |
| 0.300 | +0.000000 |
| 0.310 | +0.000000 |
| 0.320 | +0.000000 |
| 0.330 | +0.000000 |
| 0.340 | +0.000000 |
| 0.350 | +0.000000 |
| 0.360 | +0.000000 |
| 0.370 | +0.000000 |
| 0.380 | +0.000000 |
| 0.390 | +0.000000 |
| 0.400 | +0.000000 |
| 0.410 | +0.000000 |
| 0.420 | +0.000000 |
| 0.430 | +0.000000 |
| 0.440 | +0.000000 |
| 0.450 | +0.000000 |
| 0.460 | +0.000000 |
| 0.470 | +0.000000 |
| 0.480 | +0.000000 |
| 0.490 | +0.000000 |
| 0.500 | +0.000000 |
| 0.510 | +0.000000 |
| 0.520 | +0.000001 |
| 0.530 | +0.000001 |
| 0.540 | +0.000001 |
| 0.550 | +0.000001 |
| 0.560 | +0.000002 |
| 0.570 | +0.000003 |
| 0.580 | +0.000004 |
| 0.590 | +0.000006 |
| 0.600 | +0.000008 |
| 0.610 | +0.000012 |
| 0.620 | +0.000017 |
| 0.630 | +0.000025 |
| 0.640 | +0.000036 |
| 0.650 | +0.000053 |
| 0.660 | +0.000077 |
| 0.670 | +0.000112 |

This is an example of the command file generated by ATECurve and used to invoke the UNIX "gnuplot" utility.
set xlabel "Voltage(V)"
set ylabel "Current(A)"
plot "D199_PCIAD(P191)" with lines, "D262_SCSID(P246)" with
lines, "D099_NINTA(P337)" with lines
pause −1 "Take snapshot or return to exit"
This an example of the txt file created by ATECurve. It contains information that can be read by other offline utilities such as MathCad and Microsoft EXCEL for further data analysis and curve plotting. The data is first provided in row format and then the same data is provided in column format. The user can select the format of their choice.
The data (+200.00000) is included as place holders that keep all data aligned structural purposed. They are discarded after the data is read by the analysis tool.
Test Date: Aug 18 2004
Test Time: 08:20:26
This test is: BLK_OS_FUN_CON
Tester: QRT1

TABLE 7-continued

Note: This is the row formatted section however it is page wrapped. The data is actually in rows of continues data for each pin.
Pin names followed by * may be suspect.

```
     pinnamehere    −1.000000  −0.990000  −0.980000   −0.970000  −0.960000
−0.950000 −0.940000 −0.930000 −0.920000 −0.910000  −0.900000 −0.890000
−0.880000 −0.870000 −0.860000 −0.850000 −0.840000  −0.830000 −0.820000
−0.810000 −0.800000 −0.790000 −0.780000 −0.770000  −0.760000 −0.750000
−0.740000 −0.730000 −0.720000 −0.710000 −0.700000  −0.690000 −0.680000
−0.670000 −0.660000 −0.650000 −0.640000 −0.630000  −0.620000 −0.610000
−0.600000 −0.590000 −0.580000 −0.570000 −0.560000  −0.550000 −0.540000
−0.530000 −0.520000 −0.510000 −0.500000 −0.490000  −0.480000 −0.470000
−0.460000 −0.450000 −0.440000 −0.430000 −0.420000  −0.410000 −0.400000
−0.390000 −0.380000 −0.370000 −0.360000 −0.350000  −0.340000 −0.330000
−0.320000 −0.310000 −0.300000 −0.290000 −0.280000  −0.270000 −0.260000
−0.250000 −0.240000 −0.230000 −0.220000 −0.210000  −0.200000 −0.190000
−0.180000 −0.170000 −0.160000 −0.150000 −0.140000  −0.130000 −0.120000
−0.110000 −0.100000 −0.090000 −0.080000 −0.070000  −0.060000 −0.050000
−0.040000 −0.030000 −0.020000 −0.010000 +0.000000  +0.010000 +0.020000
+0.030000 +0.040000 +0.050000 +0.060000 +0.070000  +0.080000 +0.090000
+0.100000 +0.110000 +0.120000 +0.130000 +0.140000  +0.150000 +0.160000
+0.170000 +0.180000 +0.190000 +0.200000 +0.210000  +0.220000 +0.230000
+0.240000 +0.250000 +0.260000 +0.270000 +0.280000  +0.290000 +0.300000
+0.310000 +0.320000 +0.330000 +0.340000 +0.350000  +0.360000 +0.370000
+0.380000 +0.390000 +0.400000 +0.410000 +0.420000  +0.430000 +0.440000
+0.450000 +0.460000 +0.470000 +0.480000 +0.490000  +0.500000 +0.510000
+0.520000 +0.530000 +0.540000 +0.550000 +0.560000  +0.570000 +0.580000
+0.590000 +0.600000 +0.610000 +0.620000 +0.630000  +0.640000 +0.650000
+0.660000 +0.670000 +0.680000 +0.690000 +0.700000  +0.710000 +0.720000
+0.730000 +0.740000 +0.750000 +0.760000 +0.770000  +0.780000 +0.790000
+0.800000 +0.810000 +0.820000 +0.830000 +0.840000  +0.850000 +0.860000
+0.870000 +0.880000 +0.890000 +0.900000 +0.910000  +0.920000 +0.930000
+0.940000 +0.950000 +0.960000 +0.970000 +0.980000  +0.990000 +1.000000
   D199_PCIAD(P191)    +200.000000 +200.000000 +200.000000 +200.000000 +200.000000
+200.000000 +200.000000  +200.000000 +200.000000 +200.000000 +200.000000 +200.000000
+200.000000 +200.000000  +200.000000 +200.000000 +200.000000 +200.000000 +200.000000
+200.000000 +200.000000  +200.000000 +200.000000 +200.000000 +200.000000 +200.000000
+200.000000 +200.000000  +200.000000 +200.000000 +200.000000 +200.000000 +200.000000
+200.000000 +200.000000  +200.000000 +200.000000 +200.000000 +200.000000 +200.000000
+200.000000 +200.000000  +200.000000 +200.000000 +200.000000 +200.000000 +200.000000
+200.000000 +200.000000   −0.000122  −0.000099  −0.000074  −0.000054  −0.000039 −0.000028
−0.000020 −0.000014  −0.000010  −0.000008  −0.000005   −0.000004  −0.000003 −0.000002 −0.000001
−0.000001 −0.000001  −0.000000  −0.000000  −0.000000   −0.000000  −0.000000 −0.000000 −0.000000
−0.000000 −0.000000  −0.000000  −0.000000  −0.000000   −0.000000  −0.000000 −0.000000 −0.000000
−0.000000 −0.000000  −0.000000  −0.000000  −0.000000   −0.000000  −0.000000 −0.000000 −0.000000
−0.000000 −0.000000  −0.000000  +0.000000  +0.000000   −0.000000  +0.000000 +0.000000 +0.000000
+0.000000 +0.000000  +0.000000  +0.000000  +0.000000   +0.000000  +0.000000 +0.000000 +0.000000
+0.000000 +0.000000  +0.000000  +0.000000  +0.000000   +0.000000  +0.000000 +0.000000 +0.000000
+0.000000 +0.000000  +0.000000  +0.000000  +0.000000   +0.000000  +0.000000 +0.000000 +0.000000
+0.000000 +0.000000  +0.000000  +0.000000  +0.000000   +0.000000  +0.000000 +0.000000 +0.000000
+0.000000 +0.000000  +0.000000  +0.000000  +0.000000   +0.000000  +0.000000 +0.000000 +0.000000
+0.000000 +0.000000  +0.000000  +0.000000  +0.000000   +0.000000  +0.000000 +0.000001 +0.000001
+0.000001 +0.000001  +0.000002  +0.000003  +0.000004   +0.000006  +0.000008 +0.000012 +0.000018
+0.000026 +0.000037  +0.000054  +0.000079  +0.000114   +200.000000 +200.000000 +200.000000
+200.000000 +200.000000 +200.000000 +200.000000 +200.000000 +200.000000 +200.000000
+200.000000 +200.000000 +200.000000 +200.000000 +200.000000 +200.000000 +200.000000
+200.000000 +200.000000 +200.000000 +200.000000 +200.000000 +200.000000 +200.000000
+200.000000 +200.000000
   D262_SCSID(P246)   +200.000000 +200.000000 +200.000000 +200.000000 +200.000000
+200.000000 +200.000000 +200.000000 +200.000000 +200.000000 +200.000000 +200.000000
+200.000000 +200.000000 +200.000000 +200.000000 +200.000000 +200.000000 +200.000000
+200.000000 +200.000000 +200.000000 +200.000000 +200.000000 +200.000000 +200.000000
+200.000000 +200.000000 +200.000000 +200.000000 +200.000000 +200.000000 +200.000000
+200.000000 +200.000000 +200.000000 +200.000000 +200.000000 +200.000000 +200.000000
+200.000000 +200.000000 +200.000000 +200.000000 +200.000000 +200.000000 +200.000000
+200.000000 +200.000000 +200.000000 +200.000000  −0.000120 −0.000099 −0.000082 −0.000065
−0.000051 −0.000040 −0.000032 −0.000025 −0.000020  −0.000016 −0.000013 −0.000010 −0.000008
−0.000008 −0.000006 −0.000005 −0.000003 −0.000003  −0.000002 −0.000001 −0.000001 −0.000001
−0.000001 −0.000000 −0.000000 −0.000000 −0.000000  −0.000000 −0.000000 −0.000000 −0.000000
−0.000000 −0.000000 −0.000000 −0.000000 −0.000000  −0.000000 −0.000000 −0.000000 −0.000000
−0.000000 −0.000000 −0.000000 −0.000000 −0.000000  −0.000000 −0.000000 −0.000000 −0.000000
+0.000000 +0.000000 +0.000000 +0.000000 +0.000000  +0.000000 +0.000000 +0.000000 +0.000000
+0.000000 +0.000000 +0.000000 +0.000000 +0.000000  +0.000000 +0.000000 +0.000000 +0.000000
+0.000000 +0.000000 +0.000000 +0.000000 +0.000000  +0.000000 +0.000000 +0.000000 +0.000000
+0.000000 +0.000000 +0.000000 +0.000000 +0.000000  +0.000000 +0.000000 +0.000000 +0.000000
+0.000000 +0.000000 +0.000000 +0.000000 +0.000000  +0.000000 +0.000000 +0.000000 +0.000000
+0.000000 +0.000000 +0.000000 +0.000000 +0.000000  +0.000000 +0.000000 +0.000000 +0.000000
```

TABLE 7-continued

| | | | | | | | |
|---|---|---|---|---|---|---|---|
| +0.000000 | +0.000000 | +0.000000 | +0.000000 | +0.000000 | +0.000000 | +0.000000 | +0.000000 |
| +0.000000 | +0.000000 | +0.000000 | +0.000000 | +0.000000 | +0.000000 | +0.000000 | +0.000000 |
| +0.000000 | +0.000000 | +0.000000 | +0.000000 | +0.000000 | +0.000000 | +0.000000 | +0.000000 |
| +0.000000 | +0.000000 | | | | | | |

D099_NINTA(P337)  +200.000000  +200.000000  +200.000000  +200.000000  +200.000000
+200.000000 +200.000000 +200.000000 +200.000000 +200.000000 +200.000000 +200.000000
+200.000000 +200.000000 +200.000000 +200.000000 +200.000000 +200.000000 +200.000000
+200.000000 +200.000000 +200.000000 +200.000000 +200.000000 +200.000000 +200.000000
+200.000000 +200.000000 +200.000000 +200.000000 +200.000000 +200.000000 +200.000000
+200.000000 +200.000000 +200.000000 +200.000000 +200.000000 +200.000000 +200.000000
+200.000000 +200.000000 +200.000000 +200.000000 +200.000000 +200.000000 +200.000000
+200.000000 +200.000000  −0.000125 −0.000097 −0.000072 −0.000053 −0.000038 −0.000028
−0.000020 −0.000014  −0.000010 −0.000007 −0.000005  −0.000004 −0.000003 −0.000002 −0.000001
−0.000001 −0.000001  −0.000000 −0.000000 −0.000000  −0.000000 −0.000000 −0.000000 −0.000000
−0.000000 −0.000000  −0.000000 −0.000000 −0.000000  −0.000000 −0.000000 −0.000000 −0.000000
−0.000000 −0.000000  −0.000000 −0.000000 −0.000000  −0.000000 −0.000000 −0.000000 −0.000000
−0.000000 −0.000000  −0.000000 −0.000000 −0.000000  +0.000000 −0.000000 +0.000000 −0.000000
+0.000000 +0.000000  +0.000000 +0.000000 +0.000000  +0.000000 +0.000000 +0.000000 +0.000000
+0.000000 +0.000000  +0.000000 +0.000000 +0.000000  +0.000000 +0.000000 +0.000000 +0.000000
+0.000000 +0.000000  +0.000000 +0.000000 +0.000000  +0.000000 +0.000000 +0.000000 +0.000000
+0.000000 +0.000000  +0.000000 +0.000000 +0.000000  +0.000000 +0.000000 +0.000000 +0.000000
+0.000000 +0.000000  +0.000000 +0.000000 +0.000000  +0.000000 +0.000000 +0.000000 +0.000000
+0.000000 +0.000000  +0.000000 +0.000000 +0.000000  +0.000000 +0.000000 +0.000001 +0.000001
+0.000001 +0.000001  +0.000002 +0.000003 +0.000004  +0.000006 +0.000008 +0.000012 +0.000017
+0.000025 +0.000036  +0.000053 +0.000077 +0.000112  +200.000000 +200.000000 +200.000000
+200.000000 +200.000000 +200.000000 +200.000000 +200.000000 +200.000000 +200.000000
+200.000000 +200.000000 +200.000000 +200.000000 +200.000000 +200.000000 +200.000000
+200.000000 +200.000000 +200.000000 +200.000000 +200.000000 +200.000000 +200.000000
+200.000000 +200.000000 +200.000000 +200.000000 +200.000000 +200.000000 +200.000000
+200.000000 +200.000000

This ends the section of page wrapped row formatted data and starts the column format of the same data.

| Voltage | D199_PCIAD(P191) | D262_SCSID(P246) | D099_NINTA(P337) |
|---|---|---|---|
| −1.000 | +200.000000 | +200.000000 | +200.000000 |
| −0.990 | +200.000000 | +200.000000 | +200.000000 |
| −0.980 | +200.000000 | +200.000000 | +200.000000 |
| −0.970 | +200.000000 | +200.000000 | +200.000000 |
| −0.960 | +200.000000 | +200.000000 | +200.000000 |
| −0.950 | +200.000000 | +200.000000 | +200.000000 |
| −0.940 | +200.000000 | +200.000000 | +200.000000 |
| −0.930 | +200.000000 | +200.000000 | +200.000000 |
| −0.920 | +200.000000 | +200.000000 | +200.000000 |
| −0.910 | +200.000000 | +200.000000 | +200.000000 |
| −0.900 | +200.000000 | +200.000000 | +200.000000 |
| −0.890 | +200.000000 | +200.000000 | +200.000000 |
| −0.880 | +200.000000 | +200.000000 | +200.000000 |
| −0.870 | +200.000000 | +200.000000 | +200.000000 |
| −0.860 | +200.000000 | +200.000000 | +200.000000 |
| −0.850 | +200.000000 | +200.000000 | +200.000000 |
| −0.840 | +200.000000 | +200.000000 | +200.000000 |
| −0.830 | +200.000000 | +200.000000 | +200.000000 |
| −0.820 | +200.000000 | +200.000000 | +200.000000 |
| −0.810 | +200.000000 | +200.000000 | +200.000000 |
| −0.800 | +200.000000 | +200.000000 | +200.000000 |
| −0.790 | +200.000000 | +200.000000 | +200.000000 |
| −0.780 | +200.000000 | +200.000000 | +200.000000 |
| −0.770 | +200.000000 | +200.000000 | +200.000000 |
| −0.760 | +200.000000 | +200.000000 | +200.000000 |
| −0.750 | +200.000000 | +200.000000 | +200.000000 |
| −0.740 | +200.000000 | +200.000000 | +200.000000 |
| −0.730 | +200.000000 | +200.000000 | +200.000000 |
| −0.720 | +200.000000 | +200.000000 | +200.000000 |
| −0.710 | +200.000000 | +200.000000 | +200.000000 |
| −0.700 | +200.000000 | +200.000000 | +200.000000 |
| −0.690 | +200.000000 | +200.000000 | +200.000000 |
| −0.680 | +200.000000 | +200.000000 | +200.000000 |
| −0.670 | +200.000000 | +200.000000 | +200.000000 |
| −0.660 | +200.000000 | +200.000000 | +200.000000 |
| −0.650 | +200.000000 | +200.000000 | +200.000000 |
| −0.640 | +200.000000 | +200.000000 | +200.000000 |
| −0.630 | +200.000000 | +200.000000 | +200.000000 |
| −0.620 | +200.000000 | +200.000000 | +200.000000 |
| −0.610 | +200.000000 | +200.000000 | +200.000000 |
| −0.600 | +200.000000 | +200.000000 | +200.000000 |
| −0.590 | +200.000000 | +200.000000 | +200.000000 |
| −0.580 | +200.000000 | +200.000000 | +200.000000 |
| −0.570 | +200.000000 | +200.000000 | +200.000000 |
| −0.560 | +200.000000 | +200.000000 | +200.000000 |
| −0.550 | +200.000000 | +200.000000 | +200.000000 |

TABLE 7-continued

| | | | |
|---|---|---|---|
| −0.540 | +200.000000 | +200.000000 | +200.000000 |
| −0.530 | +200.000000 | +200.000000 | +200.000000 |
| −0.520 | +200.000000 | +200.000000 | +200.000000 |
| −0.510 | −0.000122 | +200.000000 | −0.000125 |
| −0.500 | −0.000099 | +200.000000 | −0.000097 |
| −0.490 | −0.000074 | −0.000120 | −0.000072 |
| −0.480 | −0.000054 | −0.000099 | −0.000053 |
| −0.470 | −0.000039 | −0.000082 | −0.000038 |
| −0.460 | −0.000028 | −0.000065 | −0.000028 |
| −0.450 | −0.000020 | −0.000051 | −0.000020 |
| −0.440 | −0.000014 | −0.000040 | −0.000014 |
| −0.430 | −0.000010 | −0.000032 | −0.000010 |
| −0.420 | −0.000008 | −0.000025 | −0.000007 |
| −0.410 | −0.000005 | −0.000020 | −0.000005 |
| −0.400 | −0.000004 | −0.000016 | −0.000004 |
| −0.390 | −0.000003 | −0.000013 | −0.000003 |
| −0.380 | −0.000002 | −0.000010 | −0.000002 |
| −0.370 | −0.000001 | −0.000008 | −0.000001 |
| −0.360 | −0.000001 | −0.000008 | −0.000001 |
| −0.350 | −0.000001 | −0.000006 | −0.000001 |
| −0.340 | −0.000000 | −0.000005 | −0.000000 |
| −0.330 | −0.000000 | −0.000003 | −0.000000 |
| −0.320 | −0.000000 | −0.000003 | −0.000000 |
| −0.310 | −0.000000 | −0.000002 | −0.000000 |
| −0.300 | −0.000000 | −0.000001 | −0.000000 |
| −0.290 | −0.000000 | −0.000001 | −0.000000 |
| −0.280 | −0.000000 | −0.000001 | −0.000000 |
| −0.270 | −0.000000 | −0.000001 | −0.000000 |
| −0.260 | −0.000000 | −0.000000 | −0.000000 |
| −0.250 | −0.000000 | −0.000000 | −0.000000 |
| −0.240 | −0.000000 | −0.000000 | −0.000000 |
| −0.230 | −0.000000 | −0.000000 | −0.000000 |
| −0.220 | −0.000000 | −0.000000 | −0.000000 |
| −0.210 | −0.000000 | −0.000000 | −0.000000 |
| −0.200 | −0.000000 | −0.000000 | −0.000000 |
| −0.190 | −0.000000 | −0.000000 | −0.000000 |
| −0.180 | −0.000000 | −0.000000 | −0.000000 |
| −0.170 | −0.000000 | −0.000000 | −0.000000 |
| −0.160 | −0.000000 | −0.000000 | −0.000000 |
| −0.150 | −0.000000 | −0.000000 | −0.000000 |
| −0.140 | −0.000000 | −0.000000 | −0.000000 |
| −0.130 | −0.000000 | −0.000000 | −0.000000 |
| −0.120 | −0.000000 | −0.000000 | −0.000000 |
| −0.110 | −0.000000 | −0.000000 | −0.000000 |
| −0.100 | −0.000000 | −0.000000 | −0.000000 |
| −0.090 | −0.000000 | −0.000000 | −0.000000 |
| −0.080 | −0.000000 | −0.000000 | −0.000000 |
| −0.070 | −0.000000 | −0.000000 | −0.000000 |
| −0.060 | +0.000000 | −0.000000 | −0.000000 |
| −0.050 | +0.000000 | −0.000000 | −0.000000 |
| −0.040 | −0.000000 | −0.000000 | +0.000000 |
| −0.030 | +0.000000 | −0.000000 | −0.000000 |
| −0.020 | +0.000000 | −0.000000 | +0.000000 |
| −0.010 | +0.000000 | −0.000000 | −0.000000 |
| 0.000 | +0.000000 | +0.000000 | +0.000000 |
| 0.010 | +0.000000 | +0.000000 | +0.000000 |
| 0.020 | +0.000000 | +0.000000 | +0.000000 |
| 0.030 | +0.000000 | +0.000000 | +0.000000 |
| 0.040 | +0.000000 | +0.000000 | +0.000000 |
| 0.050 | +0.000000 | +0.000000 | +0.000000 |
| 0.060 | +0.000000 | +0.000000 | +0.000000 |
| 0.070 | +0.000000 | +0.000000 | +0.000000 |
| 0.080 | +0.000000 | +0.000000 | +0.000000 |
| 0.090 | +0.000000 | +0.000000 | +0.000000 |
| 0.100 | +0.000000 | +0.000000 | +0.000000 |
| 0.110 | +0.000000 | +0.000000 | +0.000000 |
| 0.120 | +0.000000 | +0.000000 | +0.000000 |
| 0.130 | +0.000000 | +0.000000 | +0.000000 |
| 0.140 | +0.000000 | +0.000000 | +0.000000 |
| 0.150 | +0.000000 | +0.000000 | +0.000000 |
| 0.160 | +0.000000 | +0.000000 | +0.000000 |
| 0.170 | +0.000000 | +0.000000 | +0.000000 |
| 0.180 | +0.000000 | +0.000000 | +0.000000 |
| 0.190 | +0.000000 | +0.000000 | +0.000000 |
| 0.200 | +0.000000 | +0.000000 | +0.000000 |
| 0.210 | +0.000000 | +0.000000 | +0.000000 |
| 0.220 | +0.000000 | +0.000000 | +0.000000 |
| 0.230 | +0.000000 | +0.000000 | +0.000000 |
| 0.240 | +0.000000 | +0.000000 | +0.000000 |

TABLE 7-continued

| | | | |
|---|---|---|---|
| 0.250 | +0.000000 | +0.000000 | +0.000000 |
| 0.260 | +0.000000 | +0.000000 | +0.000000 |
| 0.270 | +0.000000 | +0.000000 | +0.000000 |
| 0.280 | +0.000000 | +0.000000 | +0.000000 |
| 0.290 | +0.000000 | +0.000000 | +0.000000 |
| 0.300 | +0.000000 | +0.000000 | +0.000000 |
| 0.310 | +0.000000 | +0.000000 | +0.000000 |
| 0.320 | +0.000000 | +0.000000 | +0.000000 |
| 0.330 | +0.000000 | +0.000000 | +0.000000 |
| 0.340 | +0.000000 | +0.000000 | +0.000000 |
| 0.350 | +0.000000 | +0.000000 | +0.000000 |
| 0.360 | +0.000000 | +0.000000 | +0.000000 |
| 0.370 | +0.000000 | +0.000000 | +0.000000 |
| 0.380 | +0.000000 | +0.000000 | +0.000000 |
| 0.390 | +0.000000 | +0.000000 | +0.000000 |
| 0.400 | +0.000000 | +0.000000 | +0.000000 |
| 0.410 | +0.000000 | +0.000000 | +0.000000 |
| 0.420 | +0.000000 | +0.000000 | +0.000000 |
| 0.430 | +0.000000 | +0.000000 | +0.000000 |
| 0.440 | +0.000000 | +0.000000 | +0.000000 |
| 0.450 | +0.000000 | +0.000000 | +0.000000 |
| 0.460 | +0.000000 | +0.000000 | +0.000000 |
| 0.470 | +0.000000 | +0.000000 | +0.000000 |
| 0.480 | +0.000000 | +0.000000 | +0.000000 |
| 0.490 | +0.000000 | +0.000000 | +0.000000 |
| 0.500 | +0.000000 | +0.000000 | +0.000000 |
| 0.510 | +0.000000 | +0.000000 | +0.000000 |
| 0.520 | +0.000001 | +0.000000 | +0.000001 |
| 0.530 | +0.000001 | +0.000000 | +0.000001 |
| 0.540 | +0.000001 | +0.000000 | +0.000001 |
| 0.550 | +0.000001 | +0.000000 | +0.000001 |
| 0.560 | +0.000002 | +0.000000 | +0.000002 |
| 0.570 | +0.000003 | +0.000000 | +0.000003 |
| 0.580 | +0.000004 | +0.000000 | +0.000004 |
| 0.590 | +0.000006 | +0.000000 | +0.000006 |
| 0.600 | +0.000008 | +0.000000 | +0.000008 |
| 0.610 | +0.000012 | +0.000000 | +0.000012 |
| 0.620 | +0.000018 | +0.000000 | +0.000017 |
| 0.630 | +0.000026 | +0.000000 | +0.000025 |
| 0.640 | +0.000037 | +0.000000 | +0.000036 |
| 0.650 | +0.000054 | +0.000000 | +0.000053 |
| 0.660 | +0.000079 | +0.000000 | +0.000077 |
| 0.670 | +0.000114 | +0.000000 | +0.000112 |
| 0.680 | +200.000000 | +0.000000 | +200.000000 |
| 0.690 | +200.000000 | +0.000000 | +200.000000 |
| 0.700 | +200.000000 | +0.000000 | +200.000000 |
| 0.710 | +200.000000 | +0.000000 | +200.000000 |
| 0.720 | +200.000000 | +0.000000 | +200.000000 |
| 0.730 | +200.000000 | +0.000000 | +200.000000 |
| 0.740 | +200.000000 | +0.000000 | +200.000000 |
| 0.750 | +200.000000 | +0.000000 | +200.000000 |
| 0.760 | +200.000000 | +0.000000 | +200.000000 |
| 0.770 | +200.000000 | +0.000000 | +200.000000 |
| 0.780 | +200.000000 | +0.000000 | +200.000000 |
| 0.790 | +200.000000 | +0.000000 | +200.000000 |
| 0.800 | +200.000000 | +0.000000 | +200.000000 |
| 0.810 | +200.000000 | +0.000000 | +200.000000 |
| 0.820 | +200.000000 | +0.000000 | +200.000000 |
| 0.830 | +200.000000 | +0.000000 | +200.000000 |
| 0.840 | +200.000000 | +0.000000 | +200.000000 |
| 0.850 | +200.000000 | +0.000000 | +200.000000 |
| 0.860 | +200.000000 | +0.000000 | +200.000000 |
| 0.870 | +200.000000 | +0.000000 | +200.000000 |
| 0.880 | +200.000000 | +0.000000 | +200.000000 |
| 0.890 | +200.000000 | +0.000000 | +200.000000 |
| 0.900 | +200.000000 | +0.000000 | +200.000000 |
| 0.910 | +200.000000 | +0.000000 | +200.000000 |
| 0.920 | +200.000000 | +0.000000 | +200.000000 |
| 0.930 | +200.000000 | +0.000000 | +200.000000 |
| 0.940 | +200.000000 | +0.000000 | +200.000000 |
| 0.950 | +200.000000 | +0.000000 | +200.000000 |
| 0.960 | +200.000000 | +0.000000 | +200.000000 |
| 0.970 | +200.000000 | +0.000000 | +200.000000 |
| 0.980 | +200.000000 | +0.000000 | +200.000000 |
| 0.990 | +200.000000 | +0.000000 | +200.000000 |
| 1.000 | +200.000000 | +0.000000 | +200.000000 |

TABLE 8
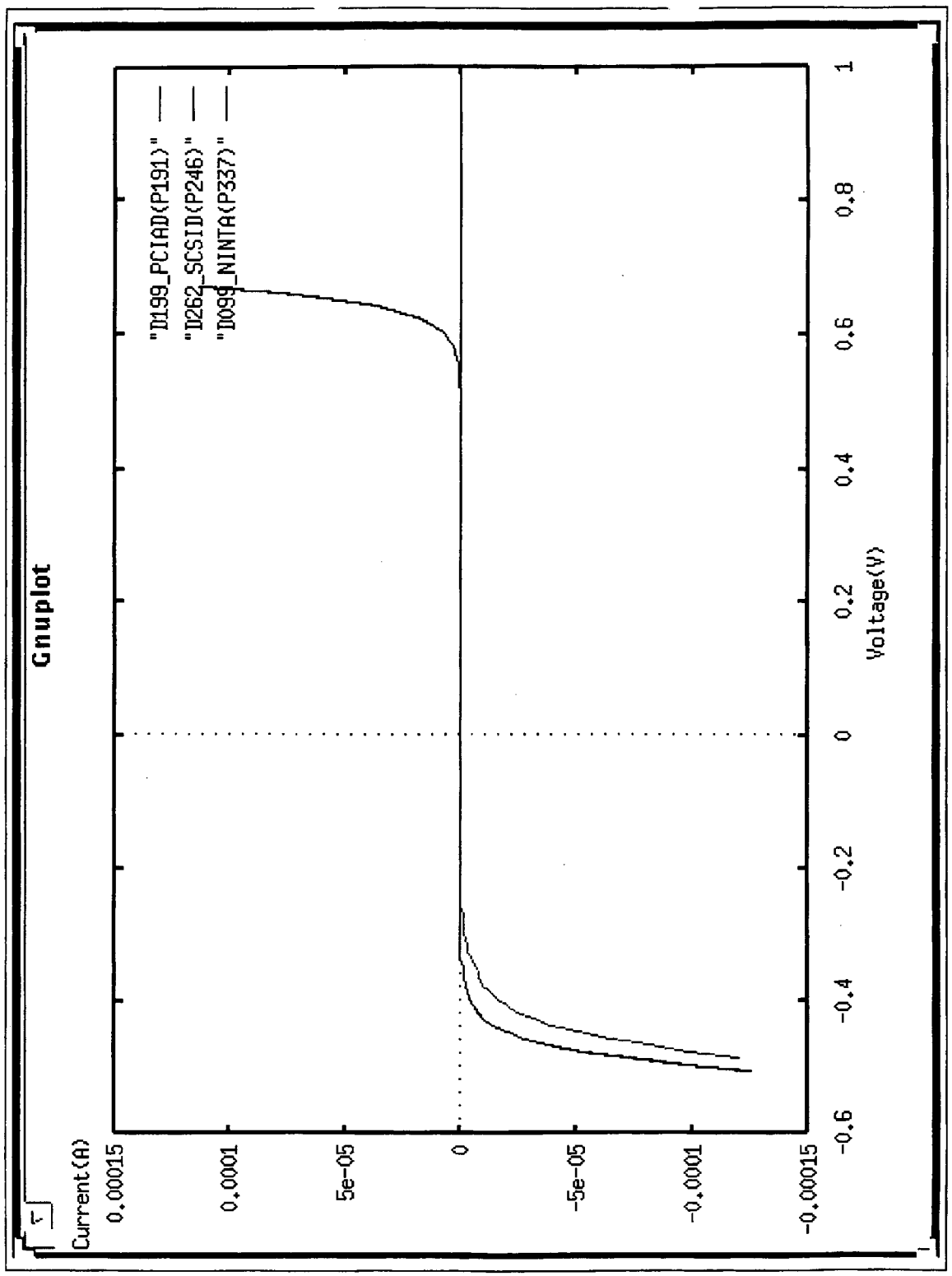

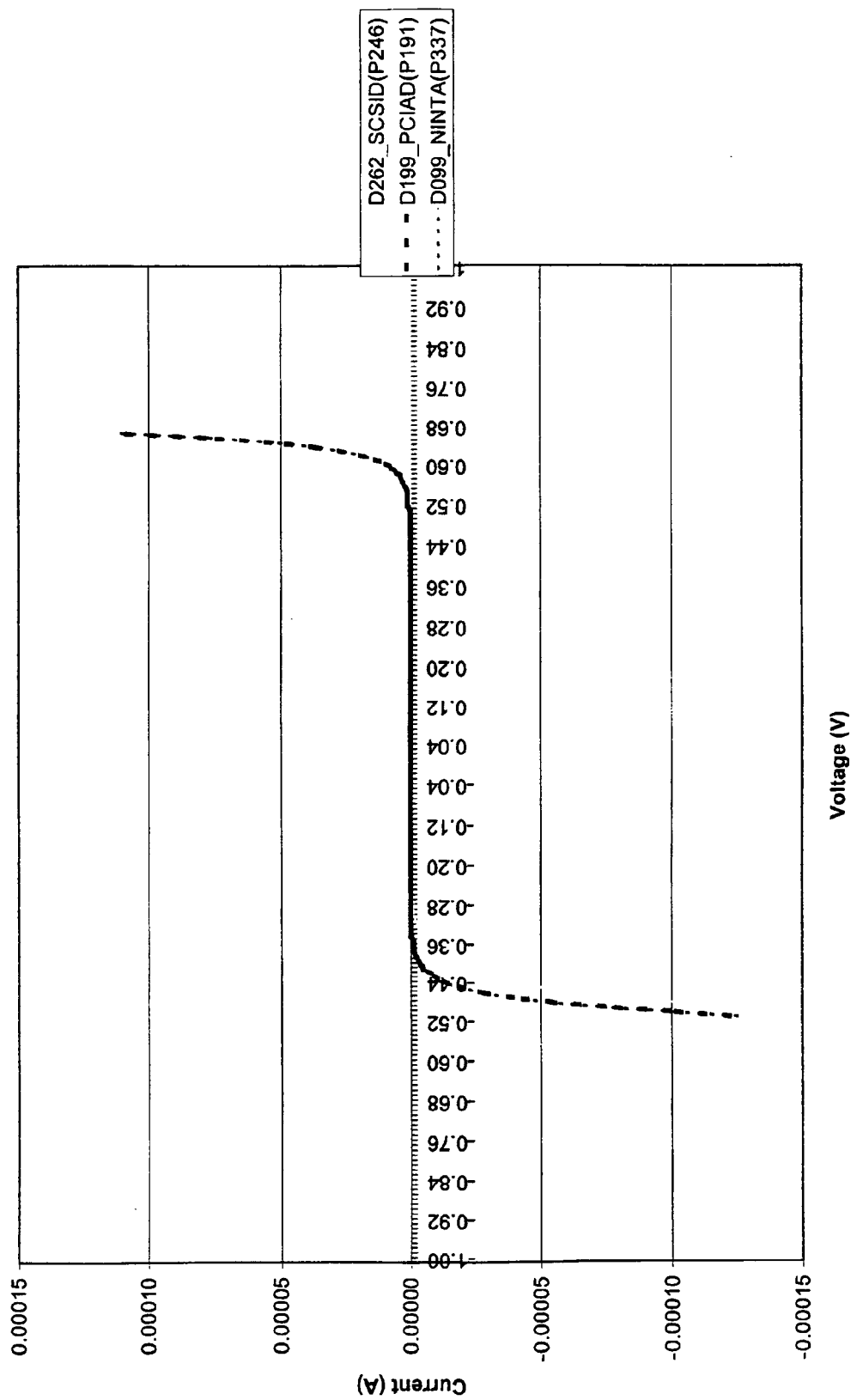

TABLE 9

The follow sections were extracted from an actual production test program run on a bad part and a good part. Both parts passed the opens and shorts test sections of the continuity test. However, the bad part actually has a resistive short on pin 44 (P44). ATECurve demonstrates that there is a resistive short on the bad part and is able to detect this problem See the charts following this data log example.

Bad part

| | | | | | | | |
|---|---|---|---|---|---|---|---|
| OPEN_NEG | D187_N_ISC | P448 | −2.000 | −467.2mV | 1.000 | 365 | pass |
| OPEN_NEG | D287_N_GNT | P31 | −2.000 | −547.9mV | 1.000 | 365 | pass |
| OPEN_NEG | D291_IDSEL | P44 | −2.000 | −574.9mV | 1.000 | 365 | pass |
| OPEN_NXG | D021_N_LOC | P259 | −2.000 | −547.9mV | 1.000 | 365 | pass |
| OPEN_NEG | D285_PCICL | P25 | −2.000 | −547.9mV | 1.000 | 365 | pass |
| . . . | | | | | | | |
| SHORT | D289_PCIAD | P41 | −3.000 | −550.4mV | −100.0m | 365 | pass |
| SHORT | D288_PCIAD | P42 | −3.000 | −547.9mV | −100.0m | 365 | pass |
| SHORT | D291_IDSEL | P44 | −3.000 | −574.9mV | −100.0m | 365 | pass |
| SHORT | D010_N_CBE | P49 | −3.000 | −545.5mV | −100.0m | 365 | pass |
| SHORT | D292_PCIAD | P50 | −3.000 | −547.9mV | −100.0m | 365 | pass |
| . . . | | | | | | | |
| BLKA_MAX | | | | 376 to 69783 | | *FAIL* | |

```
        LOW FAIL    =  .
        HIGH FAIL   =  /
    TRISTATE FAIL   =  *
  SX:NO COMPARE    =  -
Vector   Loop   Cycle   FAILED DUT PIN
500       0     125     .D020_N_DEV
Pause in "BLKA_MAX" due to functional fail
func_test(func_pins = OBPIN, start_vec = 376 , stop_vec = 69783)
```

Good part

| | | | | | | | |
|---|---|---|---|---|---|---|---|
| OPEN_NEG | D187_N_ISC | P448 | −2.000 | −477.0mV | 1.000 | 365 | pass |
| OPEN_NEG | D287_N_GNT | P31 | −2.000 | −552.8mV | 1.000 | 365 | pass |
| OPEN_NEG | D291_IDSEL | P44 | −2.000 | −552.8mV | 1.000 | 365 | pass |
| OPEN_NXG | D021_N_LOC | P259 | −2.000 | −552.8mV | 1.000 | 365 | pass |
| OPEN_NEG | D285_PCICL | P25 | −2.000 | −555.3mV | 1.000 | 365 | pass |
| . . . | | | | | | | |
| SHORT | D289_PCIAD | P41 | −3.000 | −555.3mV | −100.0m | 365 | pass |
| SHORT | D288_PCIAD | P42 | −3.000 | −552.8mV | −100.0m | 365 | pass |
| SHORT | D291_IDSEL | P44 | −3.000 | −552.8mV | −100.0m | 365 | pass |
| SHORT | D010_N_CBE | P49 | −3.000 | −555.3mV | −100.0m | 365 | pass |
| SHORT | D292_PCIAD | P50 | −3.000 | −550.4mV | −100.0m | 365 | pass |

ATECurve was used to characterize the bad part with the damaged pin 44. It clearly shows that the pin has a resistive short.
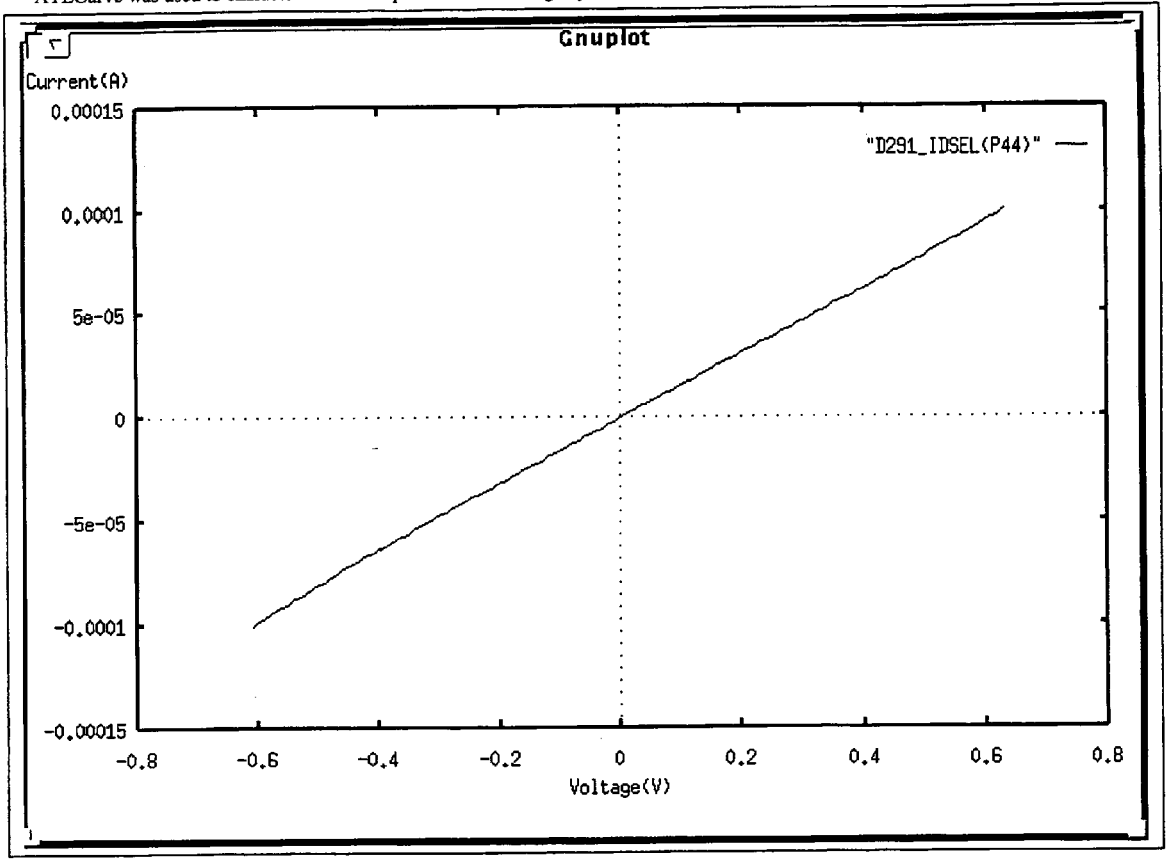

ATECurve was also used to curve trace a good part with and undamaged pin 44 for comparison, however this is really unnecessary because of the obvious atypical trace of the damaged part.
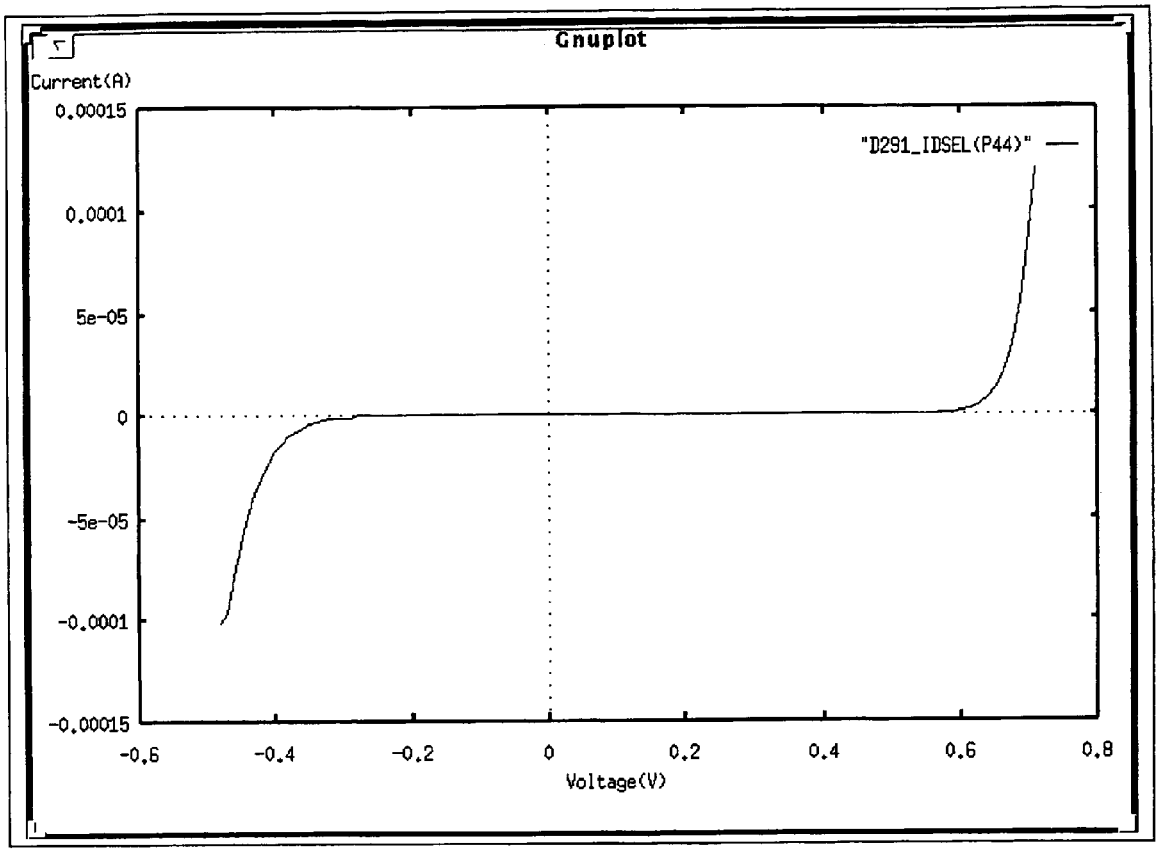

While embodiments of the present invention is shown and described, it is envisioned that those skilled in the art may devise various modifications of the present invention without departing from the spirit and scope of the appended claims.

What is claimed is:

1. A method for pausing on a SCAN based test, said method comprising the steps of:
 a) reading original SCAN chain data for a SCAN partition;
 b) saving said original SCAN chain data;
 c) rewriting said original SCAN chain data with a strobe character at a link in said original SCAN chain data where a pause is desired;
 d) setting a compare level for an output pin associated with said strobe character so that a device under test failure results when automatic test equipment executes said SCAN partition;
 e) masking all output pins except for said output pin associated with said strobe character;
 f) executing said SCAN partition to failure in order to provide a paused condition;
 g) performing any desired tasks during said paused condition;
 h) if a paused condition is necessary on another link in said original SCAN chain data, returning to step (c) of said method, otherwise moving forward to step (i); and
 i) rewriting said original SCAN chain data back to said automatic test equipment which was saved in step (b).

2. A method as defined in claim 1, wherein said strobe character is a walking strobe character.

3. A method as defined in claim 1, wherein said strobe character is a standing strobe character.

* * * * *